United States Patent
Do et al.

(10) Patent No.: US 12,159,834 B2
(45) Date of Patent: Dec. 3, 2024

(54) SEMICONDUCTOR DEVICES

(71) Applicant: Samsung Electronics Co., Ltd., Suwon-si (KR)

(72) Inventors: Jungho Do, Hwaseong-si (KR); Sanghoon Baek, Seoul (KR)

(73) Assignee: Samsung Electronics Co., Ltd. (KR)

( * ) Notice: Subject to any disclaimer, the term of this patent is extended or adjusted under 35 U.S.C. 154(b) by 427 days.

(21) Appl. No.: 17/532,052

(22) Filed: Nov. 22, 2021

(65) Prior Publication Data

US 2022/0328408 A1    Oct. 13, 2022

(30) Foreign Application Priority Data

Apr. 7, 2021  (KR) .................. 10-2021-0045463

(51) Int. Cl.
| | |
|---|---|
| *H01L 23/528* | (2006.01) |
| *H01L 21/8238* | (2006.01) |
| *H01L 27/02* | (2006.01) |
| *H01L 27/092* | (2006.01) |
| *H01L 29/06* | (2006.01) |
| *H01L 29/423* | (2006.01) |
| *H01L 29/78* | (2006.01) |
| *H01L 29/786* | (2006.01) |

(52) U.S. Cl.
CPC .. *H01L 23/5286* (2013.01); *H01L 21/823871* (2013.01); *H01L 23/528* (2013.01); *H01L 23/5283* (2013.01); *H01L 27/0207* (2013.01); *H01L 27/0924* (2013.01); *H01L 29/0665* (2013.01); *H01L 29/42392* (2013.01); *H01L 29/7851* (2013.01); *H01L 29/78645* (2013.01); *H01L 29/78696* (2013.01)

(58) Field of Classification Search
CPC .............. H01L 23/5286; H01L 23/528; H01L 21/823871; H01L 27/0207; H01L 27/0924; H01L 29/42392; H01L 27/092; H01L 29/66439; H01L 29/775; H01L 23/535
See application file for complete search history.

(56) References Cited

U.S. PATENT DOCUMENTS

| | | | |
|---|---|---|---|
| 7,895,551 B2 | 2/2011 | Shah et al. | |
| 8,513,978 B2 | 8/2013 | Sherlekar | |
| 8,698,205 B2 | 4/2014 | Tzeng et al. | |
| 8,788,998 B2 | 7/2014 | Hatamian et al. | |
| 9,262,570 B2 | 2/2016 | Hsu et al. | |
| 9,564,211 B2 | 2/2017 | Liaw | |
| 10,268,793 B2 | 4/2019 | Lee et al. | |
| 2011/0049575 A1* | 3/2011 | Tanaka | H01L 27/11807 257/E27.013 |
| 2020/0273851 A1* | 8/2020 | Liaw | H01L 29/161 |
| 2022/0045056 A1* | 2/2022 | Wang | H01L 23/485 |

* cited by examiner

*Primary Examiner* — Evan G Clinton
(74) *Attorney, Agent, or Firm* — Myers Bigel, P.A.

(57) ABSTRACT

Disclosed is a semiconductor device comprising a mixed height cell on a substrate, and a first power line and a second power line that run across the mixed height cell. First to third line tracks are defined between the first power line and the second power line. A fourth line track is defined adjacent to the second power line. The second power line is between the third line track and the fourth line track. The mixed height cell includes a plurality of lower lines aligned with the first to fourth line tracks. A cell height of the mixed height cell is about 1.25 times to about 1.5 times a distance between a first point of the first power line and a corresponding second point of the second power line.

17 Claims, 35 Drawing Sheets

SEMICONDUCTOR DEVICES

CROSS-REFERENCE TO RELATED APPLICATION

This U.S. non-provisional application claims priority under 35 U.S.C § 119 to Korean Patent Application No. 10-2021-0045463 filed on Apr. 7, 2021 in the Korean Intellectual Property Office, the disclosure of which is hereby incorporated by reference in its entirety.

BACKGROUND

The present disclosure relates to semiconductor devices. Semiconductor devices are beneficial in the electronics industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly demanded for high integration with the advanced development of the electronics industry. For example, semiconductor devices have been increasingly requested for high reliability, high speed, and/or multi-functionality. Semiconductor devices are gradually becoming more complicated and more integrated to meet these requested characteristics.

SUMMARY

Some embodiments of the present inventive concepts provide a semiconductor device including a field effect transistor with increased integration and improved electrical characteristics.

According to some embodiments of the present inventive concepts, a semiconductor device may comprise: a substrate that includes a first region, a second region, and a third region, the first region being an NMOSFET region, and the second region being a PMOSFET region; a first active pattern on the PMOSFET region and a second active pattern on the NMOSFET region; a plurality of gate electrodes on the first and second active patterns; a plurality of first source/drain patterns on an upper portion of the first active pattern and a plurality of second source/drain patterns on an upper portion of the second active pattern; a plurality of active contacts on the first and second source/drain patterns; a plurality of gate contacts on the gate electrodes; and a first metal layer on the active contacts and the gate contacts. The first metal layer may include a first power line, a second power line, and first to fourth lower lines. The first to third lower lines may be between the first power line and the second power line. The fourth lower line may be on the third region. The gate electrodes may include first to fourth gate electrodes. The first gate electrode and the fourth gate electrode may be configured to have a first signal applied in common thereto. The second gate electrode and the third gate electrode may be configured to have a second signal applied in common thereto through the first lower line, the fourth lower line, and a first active contact of the active contacts that electrically connects the first lower line to the fourth lower line.

According to some embodiments of the present inventive concepts, a semiconductor device may comprise: a mixed height cell on a substrate; and a first power line and a second power line that run across the mixed height cell. First to third line tracks may be defined between the first power line and the second power line. A fourth line track may be defined adjacent to the second power line. The second power line may be between the third line track and the fourth line track. The mixed height cell may include first to fourth lower lines aligned with the first to fourth line tracks, respectively. A cell height of the mixed height cell may be about 1.25 times to about 1.5 times a distance between a first point of the first power line and a corresponding second point of the second power line.

According to some embodiments of the present inventive concepts, a semiconductor device may comprise: a mixed height cell on a substrate; and a first power line and a second power line that run across the mixed height cell. First to third line tracks may be defined between the first power line and the second power line. A fourth line track may be defined adjacent to the second power line. The second power line may be between the third line track and the fourth line track. The mixed height cell may include: first to fourth gate electrodes; and a plurality of lower lines aligned with the first to fourth line tracks. The first gate electrode and the fourth gate electrode may be configured to have a first signal applied in common thereto. The second gate electrode and the third gate electrode may be configured to have a second signal applied in common thereto through a first lower line on one of the first to third line tracks and through a second lower line on the fourth line track.

DETAILED DESCRIPTION

FIGS. 1 to 4 illustrate conceptual views showing logic cells of a semiconductor device according to some embodiments of the present inventive concepts.

Figure 1:
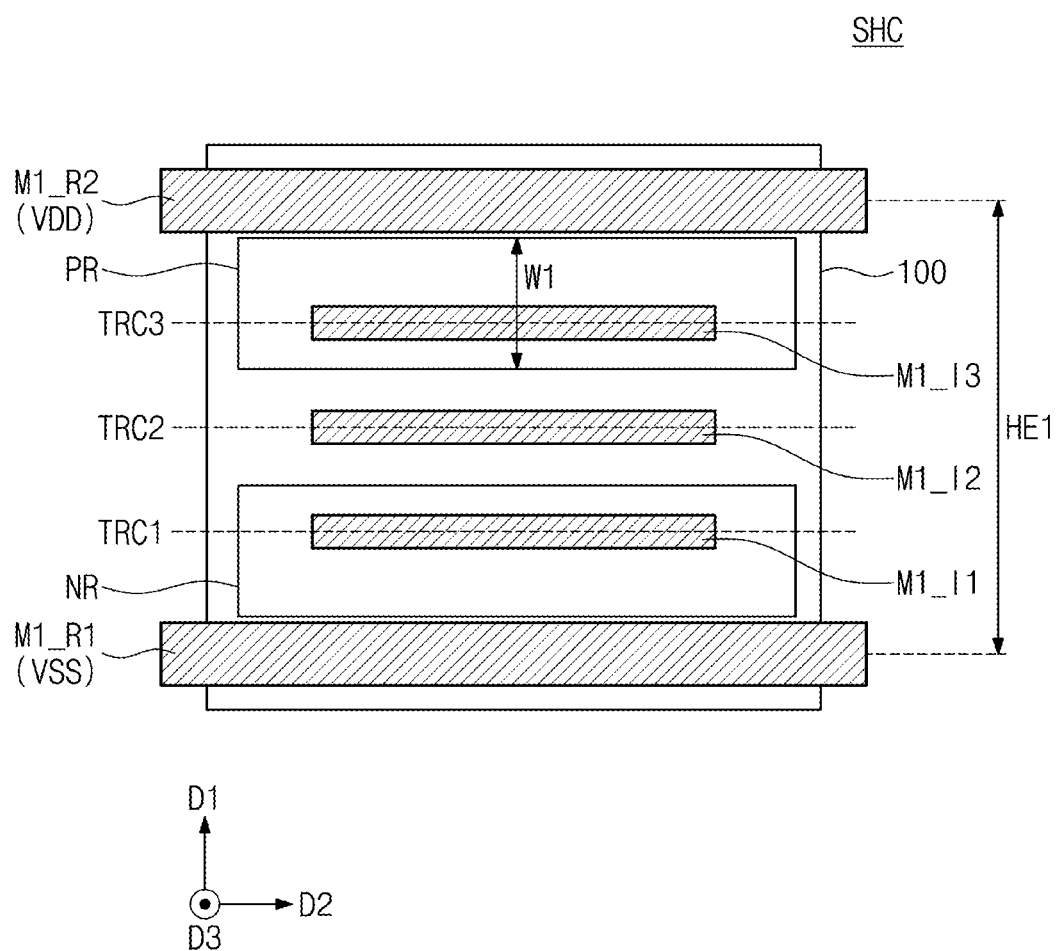
FIGS. 1 to 4 illustrate conceptual views showing logic cells of a semiconductor device according to some embodiments of the present inventive concepts.

Referring to FIG. 1, a single height cell SHC may be provided. For example, a substrate 100 may be provided thereon with a first power line M1_R1 and a second power line M1_R2. The first power line M1_R1 may be a path for providing a source voltage VSS, for example, a ground voltage. The second power line M1_R2 may be a path for providing a drain voltage VDD, for example, a power voltage.

The single height cell SHC may be defined between the first power line M1_R1 and the second power line M1_R2. The single height cell SHC may include one PMOSFET region PR and one NMOSFET region NR. For example, the single height cell SHC may have a CMOS structure provided between the first power line M1_R1 and the second power line M1_R2.

Each of the PMOSFET and NMOSFET regions PR and NR may have a first width W1 in a first direction D1. A first height HE1 may be defined as a length in the first direction D1 of the single height cell SHC. The first height HE1 may be substantially the same as a distance (e.g., pitch) between the first power line M1_R1 and the second power line M1_R2. As used herein with respect to the first power line M1_R1 and the second power line M1_R2, the term "pitch" refers to a distance between a first point (e.g., a center point in the first direction D1) of the first power line M1_R1 and a corresponding second point (e.g., a center point in the first direction D1) of the second power line M1_R2.

First, second, and third line tracks TRC1, TRC2, and TRC3 may be defined between the first power line M1_R1 and the second power line M1_R2. The first, second, and third line tracks TRC1, TRC2, and TRC3 may be imaginary lines each of which extends parallel to a second direction D2. The first, second, and third line tracks TRC1, TRC2, and TRC3 may be arranged along the first direction D1 at a regular pitch.

First, second, and third lower lines M1_I1, M1_I2, and M1_I3 may be provided between the first power line M1_R1 and the second power line M1_R2. The first, second, and third lower lines M1_I1, M1_I2, and M1_I3 may extend parallel to each other in the second direction D2. A first metal layer M1 may be constituted by the first power line M1_R1, the second power line M1_R2, and the first, second, and third lower lines M1_I1, M1_I2, and M1_I3.

The first, second, and third line tracks TRC1, TRC2, and TRC3 may define positions where the first, second, and third lower lines M1_I1, M1_I2, and M1_I3 will be located respectively. For example, the first lower line M1_I1 may be located aligned with the first line track TRC1, the second lower line M1_I2 may be located aligned with the second line track TRC2, and the third lower line M1_I3 may be located aligned with the third line track TRC3.

The single height cell SHC may constitute one logic cell. In some embodiments, the logic cell may mean a logic device, such as an AND, OR, XOR, XNOR, or inverter device, that performs a specific function. For example, the logic cell may include transistors for constituting a logic device and wiring lines that connect the transistors to each other.

Figure 2:
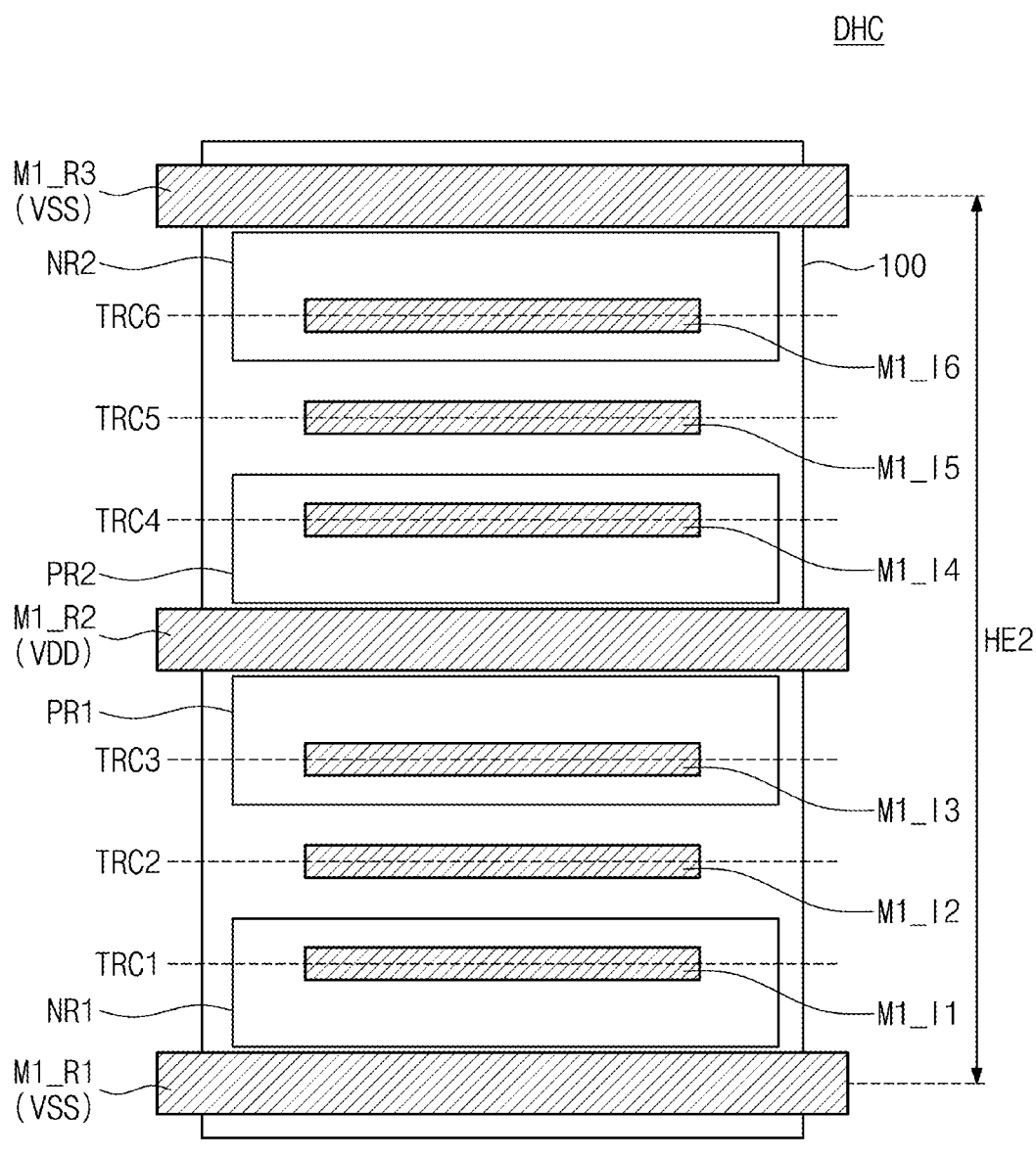
Figure 2:
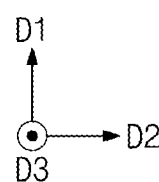

Referring to FIG. 2, a double height cell DHC may be provided. For example, a substrate 100 may be provided thereon with a first power line M1_R1, a second power line M1_R2, and a third power line M1_R3. The second power line M1_R2 may be located between the first power line M1_R1 and the third power line M1_R3. The third power line M1_R3 may be a path for providing a source voltage VSS.

The double height cell DHC may be defined between the second power line M1_R2 and the third power line M1_R3 (e.g., in addition to being defined between the first power line M1_R1 and the second power line M1_R2). The double height cell DHC may include a first PMOSFET region PR1, a second PMOSFET region PR2, a first NMOSFET region NR1, and a second NMOSFET region NR2. The first NMOSFET region NR1 may be adjacent to the first power line M1_R1. The second NMOSFET region NR2 may be adjacent to the third power line M1_R3. The first and second PMOSFET regions PR1 and PR2 may be adjacent to opposite sides of the second power line M1_R2. When viewed in plan, the second power line M1_R2 may be located between the first and second PMOSFET regions PR1 and PR2.

First, second, and third line tracks TRC1, TRC2, and TRC3 may be defined between the first power line M1_R1 and the second power line M1_R2. Fourth, fifth, and sixth line tracks TRC4, TRC5, and TRC6 may be defined between the second power line M1_R2 and the third power line M1_R3. The first to sixth line tracks TRC1 to TRC6 may define positions where first to sixth lower lines M1_I1 to M1_I6 will be located respectively. For example, the first to sixth lower lines M1_I1 to M1_I6 may be located aligned with the first to sixth line tracks TRC1 to TRC6, respectively.

A second height HE2 may be defined as a length in the first direction D1 of the double height cell DHC. The second height HE2 may be about twice the first height HE1 of FIG. 1. The first and second PMOSFET regions PR1 and PR2 of the double height cell DHC may collectively operate as a single PMOSFET region. Therefore, the double height cell DHC may have a PMOS transistor whose channel size is greater than that of a PMOS transistor included in the single height cell SHC discussed above in FIG. 1.

For example, the channel size of the PMOS transistor included in the double height cell DHC may be about twice that of the PMOS transistor included in the single height cell SHC. In conclusion, the double height cell DHC may operate at a higher speed than that of the single height cell SHC.

The number of line tracks where lower lines will be located may be greater on the double height cell DHC than on the single height cell SHC. For example, the number of line tracks on the double height cell DHC may be about twice that of line tracks on the single height cell SHC. Therefore, in comparison with the single height cell SHC, the double height cell DHC may increase in the number of signal delivery lines and in the degree of freedom of routing.

In the present inventive concepts, the double height cell DHC shown in FIG. 2 may be defined as a multi-height cell. Although not shown, the multi-height cell may include a triple height cell whose cell height is about three times that of the single height cell SHC.

Figure 3:
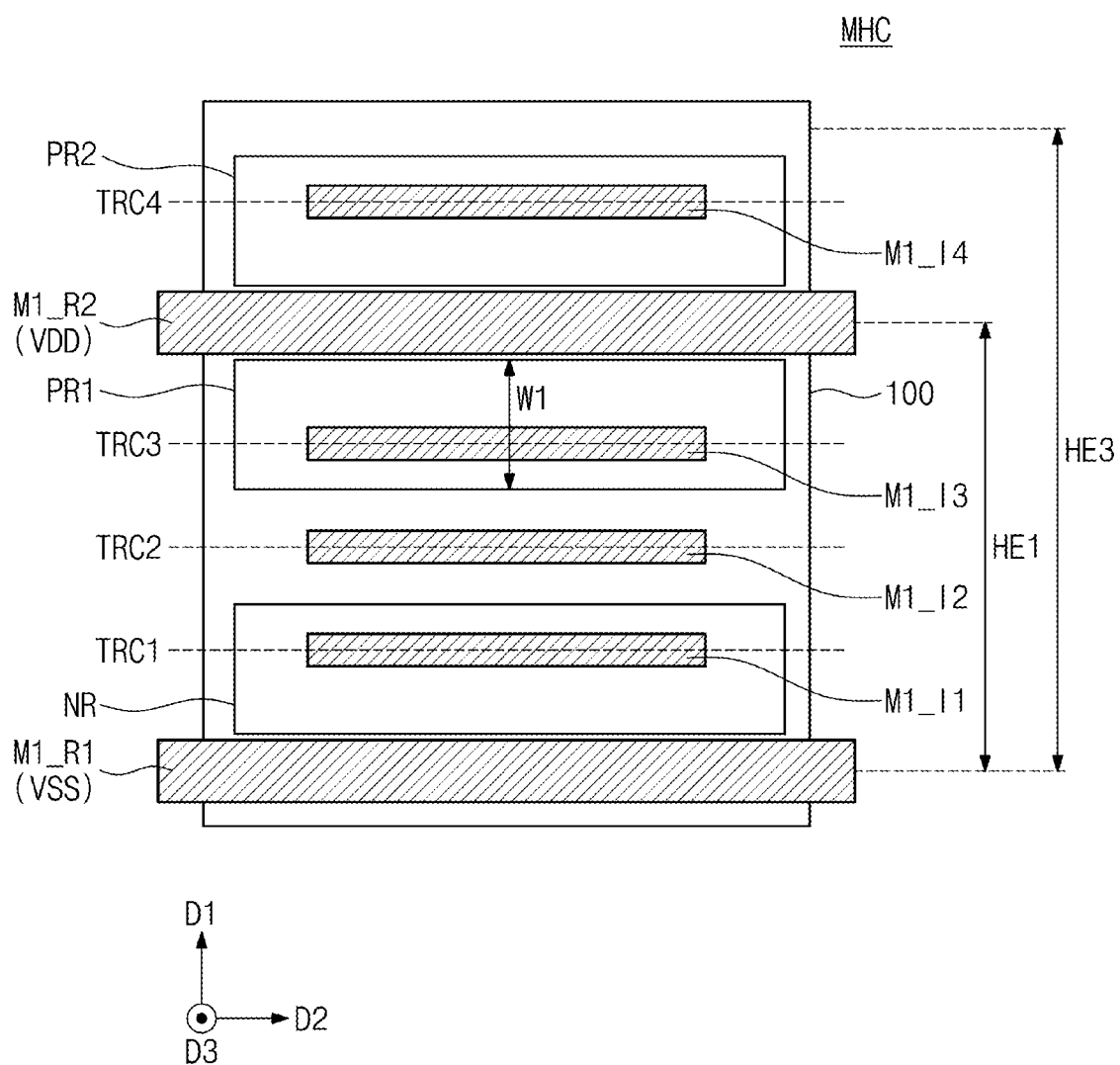

Referring to FIG. 3, a mixed height cell MHC may be provided. For example, a substrate 100 may be provided thereon with a first power line M1_R1 and a second power line M1_R2. The mixed height cell MHC may include a first region NR, a second region PR1, and a third region PR2. For example, the first region NR may be an NMOSFET region, the second region PR1 may be a first PMOSFET region, and the third region PR2 may be a second PMOSFET region. When viewed in plan, the second power line M1_R2 may be located between the first and second PMOSFET regions PR1 and PR2.

In comparison with the single height cell SHC of FIG. 1, the mixed height cell MHC may additionally include the second PMOSFET region PR2. Unlike the double height cell DHC of FIG. 2, the mixed height cell MHC may not include the second NMOSFET region NR2. A third height HE3 may be defined as a length in the first direction D1 of the mixed height cell MHC. The third height HE3 may be about 1.25 times to about 1.5 times the first height HE1 of FIG. 1.

First, second, and third line tracks TRC1, TRC2, and TRC3 may be defined between the first power line M1_R1 and the second power line M1_R2. A fourth line track TRC4 may be defined on the second PMOSFET region PR2. The first to fourth line tracks TRC1 to TRC4 may define positions where first to fourth lower lines M1_I1 to M1_I4 will be located respectively. For example, the first to fourth lower lines M1_I1 to M1_I4 may be located aligned with the first to fourth line tracks TRC1 to TRC4, respectively.

In some embodiments, the first and second PMOSFET regions PR1 and PR2 of the mixed height cell MHC may collectively operate as a single PMOSFET region. Therefore, the mixed height cell MHC may have a PMOS transistor whose channel size is greater than that of a PMOS transistor included in the single height cell SHC discussed above in FIG. 1.

In some embodiments, one of the first and second PMOSFET regions PR1 and PR2 of the mixed height cell MHC may be a dummy region. For example, the mixed height cell MHC may have a PMOS transistor whose channel size is the same as that of a PMOS transistor included in the single height cell SHC discussed above in FIG. 1.

In some embodiments, although not shown, the mixed height cell MHC may include a PMOSFET region, a first NMOSFET region, and a second NMOSFET region.

The mixed height cell MHC may be employed as a complex cell of logic cells. For example, the complex cell may include at least one selected from MUX, XOR, XNOR, latch, flip-flop, and clock gating. The complex cell may have a relatively large number of signal lines in the first metal layer M1.

The number of line tracks on which lower lines will be located may be greater on the mixed height cell MHC than on the single height cell SHC. For example, the number of line tracks on the double height cell DHC may be about four, and the number of line tracks on the single height cell SHC may be about three. Therefore, in comparison with the single height cell SHC, the mixed height cell MHC may increase in the number of signal delivery lines and in the degree of freedom of routing. The mixed height cell MHC may be appropriate for a complex cell.

The third height HE3 of the mixed height cell MHC may be less than the second height HE2 of the double height cell DHC depicted in FIG. 2. For example, the mixed height cell MHC may have an area less than that of the double height cell DHC. In conclusion, in comparison with the double height cell DHC, the area of the mixed height cell MHC may be reduced to increase integration of a semiconductor device.

Figure 4:
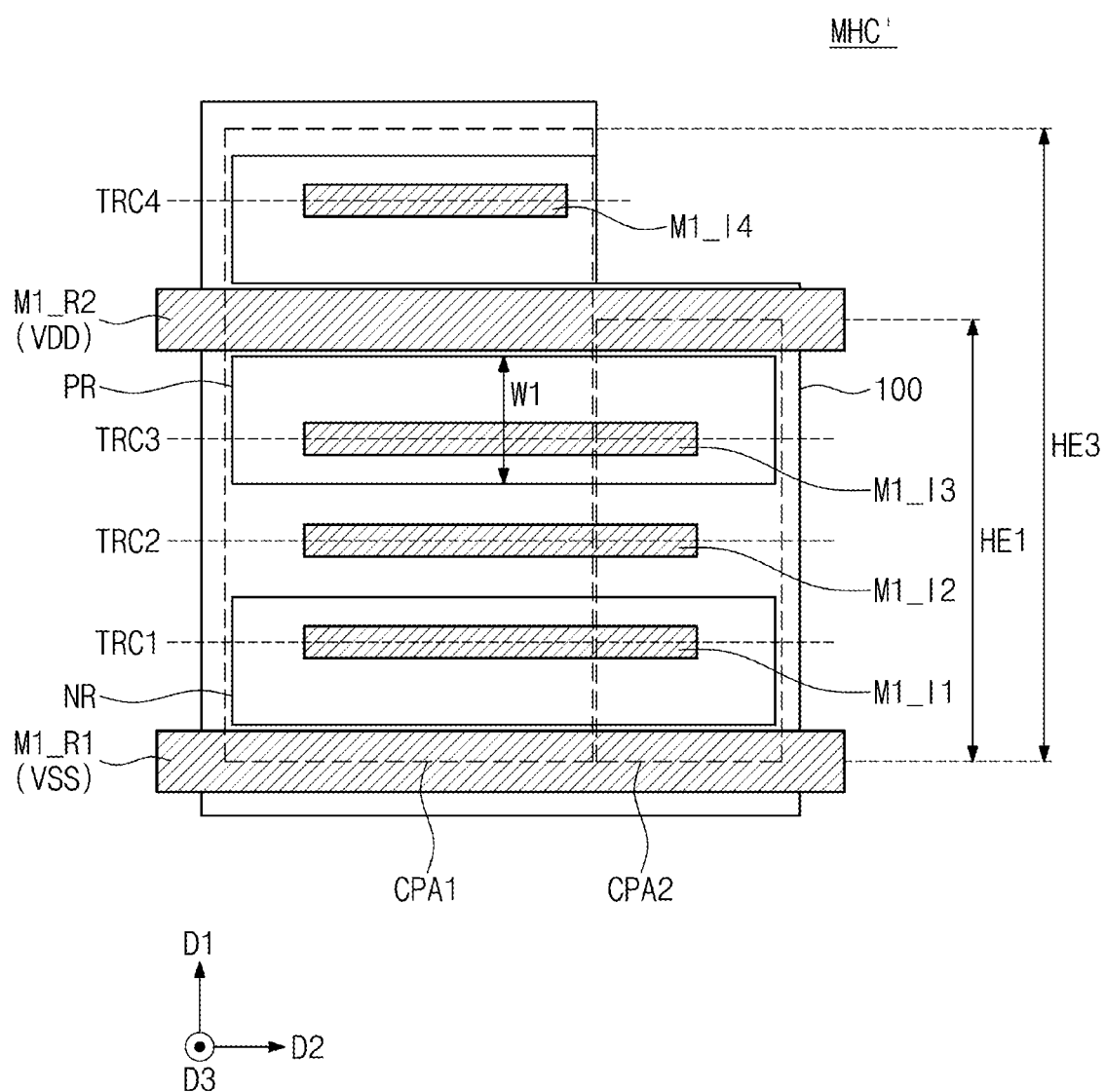

Referring to FIG. 4, there may be provided a mixed height cell MHC' according to some embodiments of the present inventive concepts. The mixed height cell MHC' may include a first cell region CPA1 having a third height HE3 and a second cell region CPA2 having a first height HE1.

First to fourth line tracks TRC1 to TRC4 may be defined on the first cell region CPA1, and first to third line tracks TRC1 to TRC3 may be defined on the second cell region CPA2.

The first cell region CPA1 may be analogous to the mixed height cell MHC of FIG. 3, and the second cell region CPA2 may be analogous to the single height cell SHC of FIG. 1. The mixed height cell MHC' may have a shape obtained by merging at least one mixed height cell MHC with at least one single height cell SHC. Therefore, the mixed height cell MHC' may have a polygonal shape other than a tetragonal shape.

The mixed height cell MHC' may be configured such that the first cell region CPA1 causes an increase in the number of line tracks, and that the second cell region CPA2 causes a reduction in area of the mixed height cell MHC'. Accordingly, in comparison with the mixed height cell MHC of FIG. 3, the mixed height cell MHC' may have a reduced cell area while obtaining a similar degree of freedom of routing, which may result in an increase in integration of the mixed height cell MHC'.

FIGS. 5 to 8 illustrate plan views showing logic cells that are two-dimensionally located on a substrate.

Figure 5:
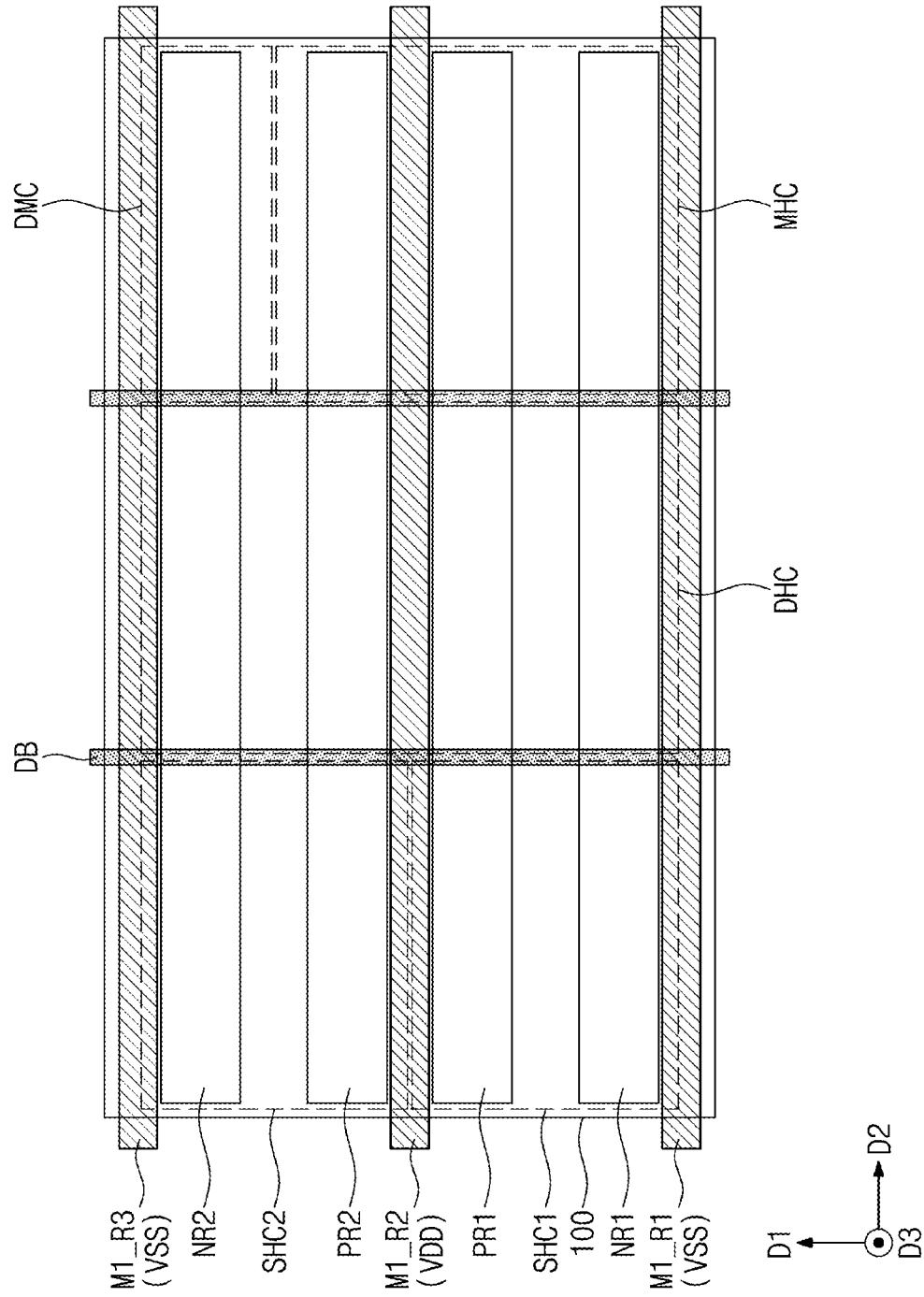
FIGS. 5 to 8 illustrate plan views showing logic cells that are two-dimensionally located on a substrate.

Referring to FIG. 5, a substrate 100 may be provided with a first single height cell SHC1, a second single height cell SHC2, and a double height cell DHC, a mixed height cell MHC, and a filler cell DMC that are two-dimensionally located thereon.

The first single height cell SHC1 may be located between a first power line M1_R1 and a second power line M1_R2. The second single height cell SHC2 may be located between the second power line M1_R2 and a third power line M1_R3. The second single height cell SHC2 may be adjacent in a first direction D1 to the first single height cell SHC1.

The double height cell DHC may be located between the first power line M1_R1 and the third power line M1_R3. The double height cell DHC may be adjacent in a second direction D2 to the first and second single height cells SHC1 and SHC2.

The mixed height cell MHC may be located to include not only the first and second power lines M1_R1 and M1_R2, but also a second PMOSFET region PR2. The mixed height cell MHC may be adjacent in the second direction D2 to the double height cell DHC.

The filler cell DMC may be located on an empty zone between the mixed height cell MHC and the third power line M1_R3. The filler cell DMC may be a dummy cell that fills an empty space between logic cells disposed based on a circuit design. For example, the filler cell DMC may have no circuit function.

A separation structure DB may be provided between the first single height cell SHC1 and the double height cell DHC and between the second single height cell SHC2 and the double height cell DHC. The separation structure DB may also be provided between the double height cell DHC and the mixed height cell MHC. The separation structure DB may cause logic cells to have their active regions electrically separated from each other.

Figure 6:
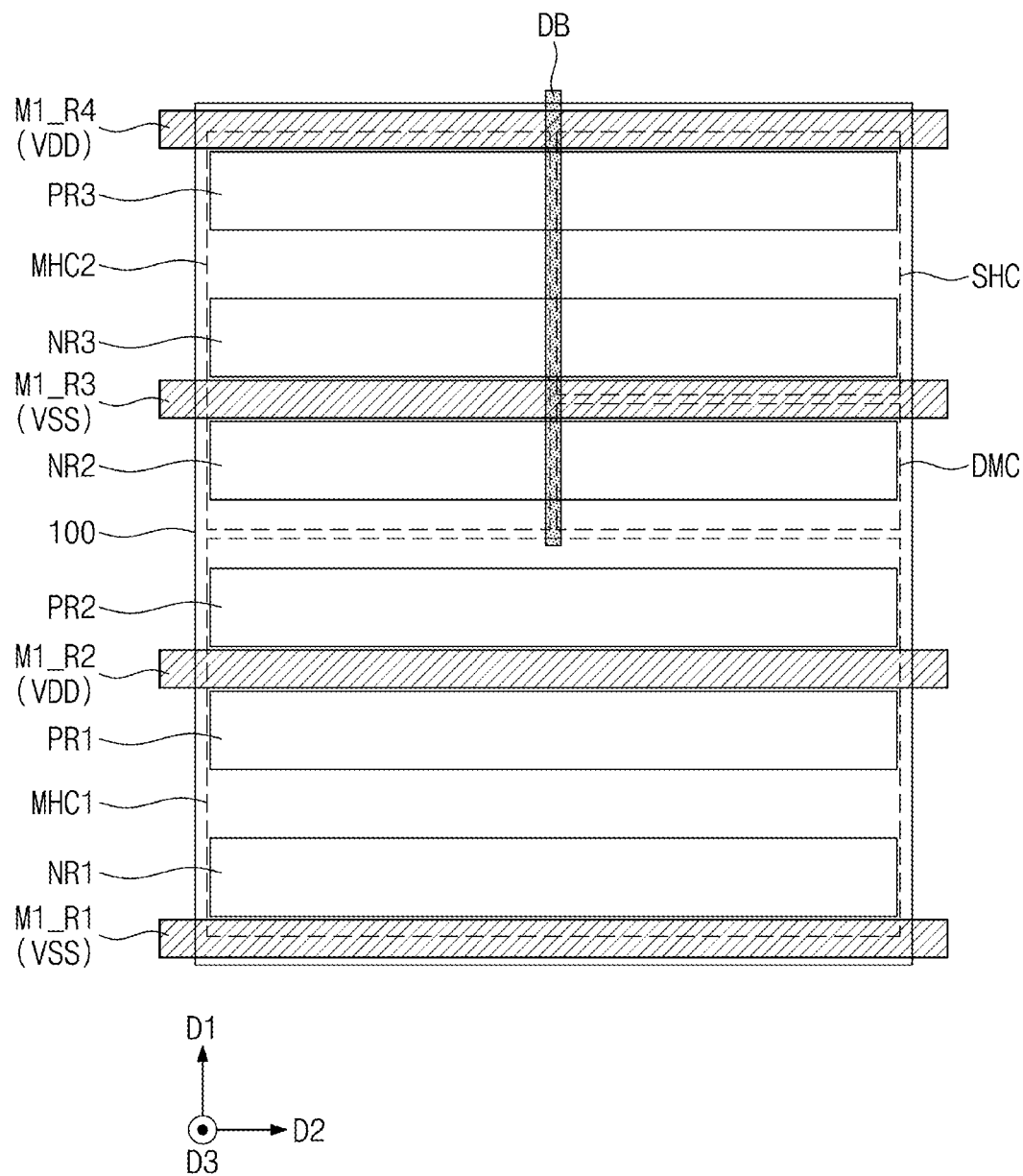

Referring to FIG. 6, logic cells may be located on first to fourth power lines M1_R1 to M1_R4. A first mixed height cell MHC1 may be located on the first and second power lines M1_R1 and M1_R2. A second mixed height cell MHC2 may be located on the third and fourth power lines M1_R3 and M1_R4. The second mixed height cell MHC2 may be adjacent in a first direction D1 to the first mixed height cell MHC1. The first mixed height cell MHC1 may include a second PMOSFET region PR2 between the second and third power lines M1_R2 and M1_R3. The second mixed height cell MHC2 may include a second NMOSFET region NR2 between the second and third power lines M1_R2 and M1_R3.

A single height cell SHC may be located between the third and fourth power lines M1_R3 and M1_R4. The single height cell SHC may be adjacent in a second direction D2 to the second mixed height cell MHC2. A filler cell DMC may be located between the single height cell SHC and the first mixed height cell MHC1.

Figure 7:
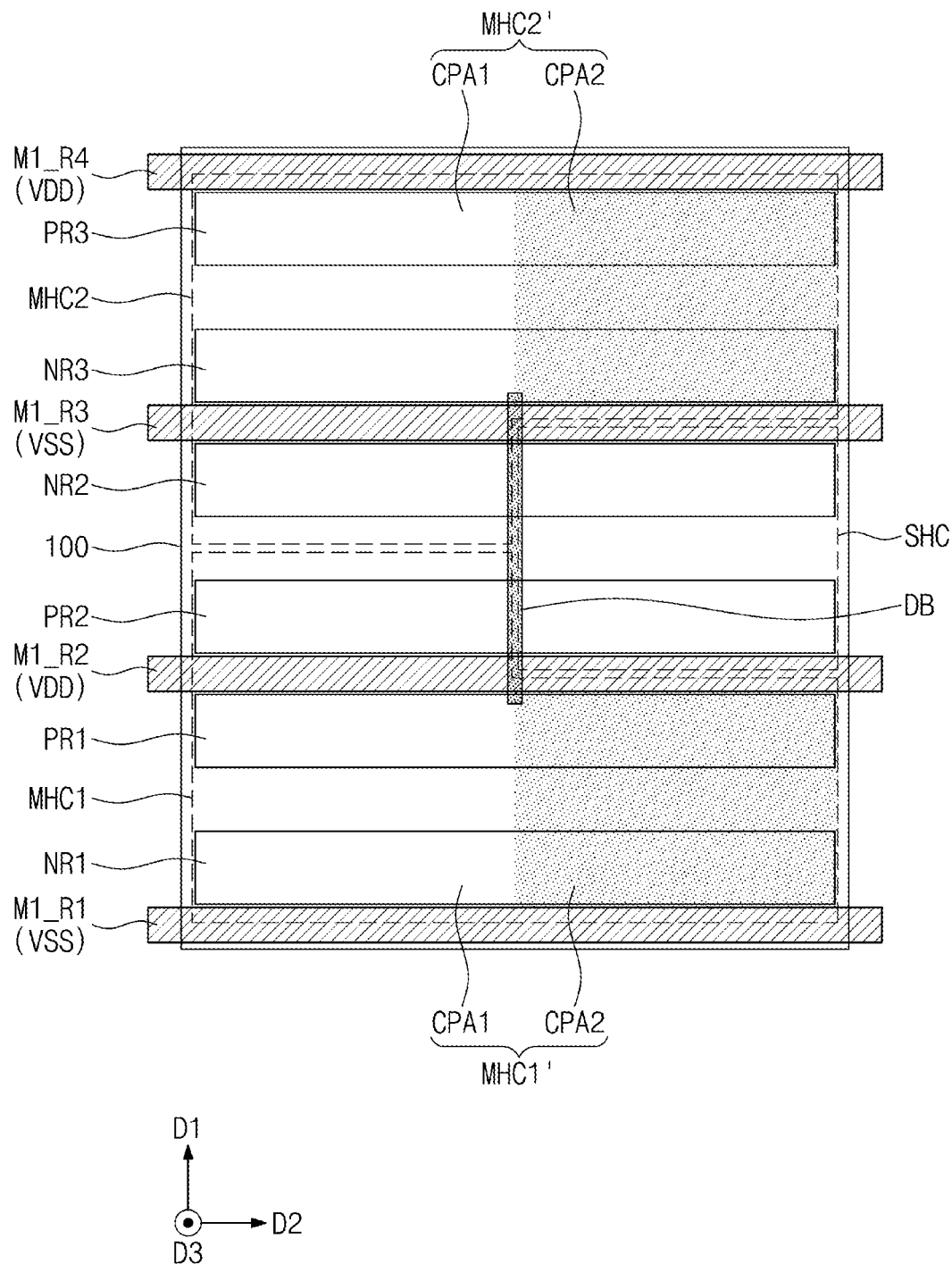

Referring to FIG. 7, logic cells may be located on first to fourth power lines M1_R1 to M1_R4. A first mixed height cell MHC1' of FIG. 4 may be located on the first and second power lines M1_R1 and M1_R2. A second mixed height cell MHC2' of FIG. 4 may be located on the third and fourth power lines M1_R3 and M1_R4. The second mixed height cell MHC2' may be adjacent in a first direction D1 to the first mixed height cell MHC1'. A first cell region CPA1 of the first mixed height cell MHC1' may include a second PMOSFET region PR2 between the second and third power lines M1_R2 and M1_R3. A first cell region CPA1 of the second mixed height cell MHC2' may include a second NMOSFET region NR2 between the second and third power lines M1_R2 and M1_R3.

A single height cell SHC may be located between the first mixed height cell MHC1' and the second mixed height cell MHC2'. For example, the single height cell SHC may be interposed between a second cell region CPA2 of the first mixed height cell MHC1' and a second cell region CPA2 of the second mixed height cell MHC2'.

Each of the first and second mixed height cells MHC1' and MHC2' may include the first cell region CPA1 and the second cell region CPA2 whose heights are different from each other, and thus it may be possible to securely obtain a space in which the single height cell SHC is located between the first and second mixed height cells MHC1' and MHC2'. As a result, a semiconductor device may increase in integration.

Figure 8:
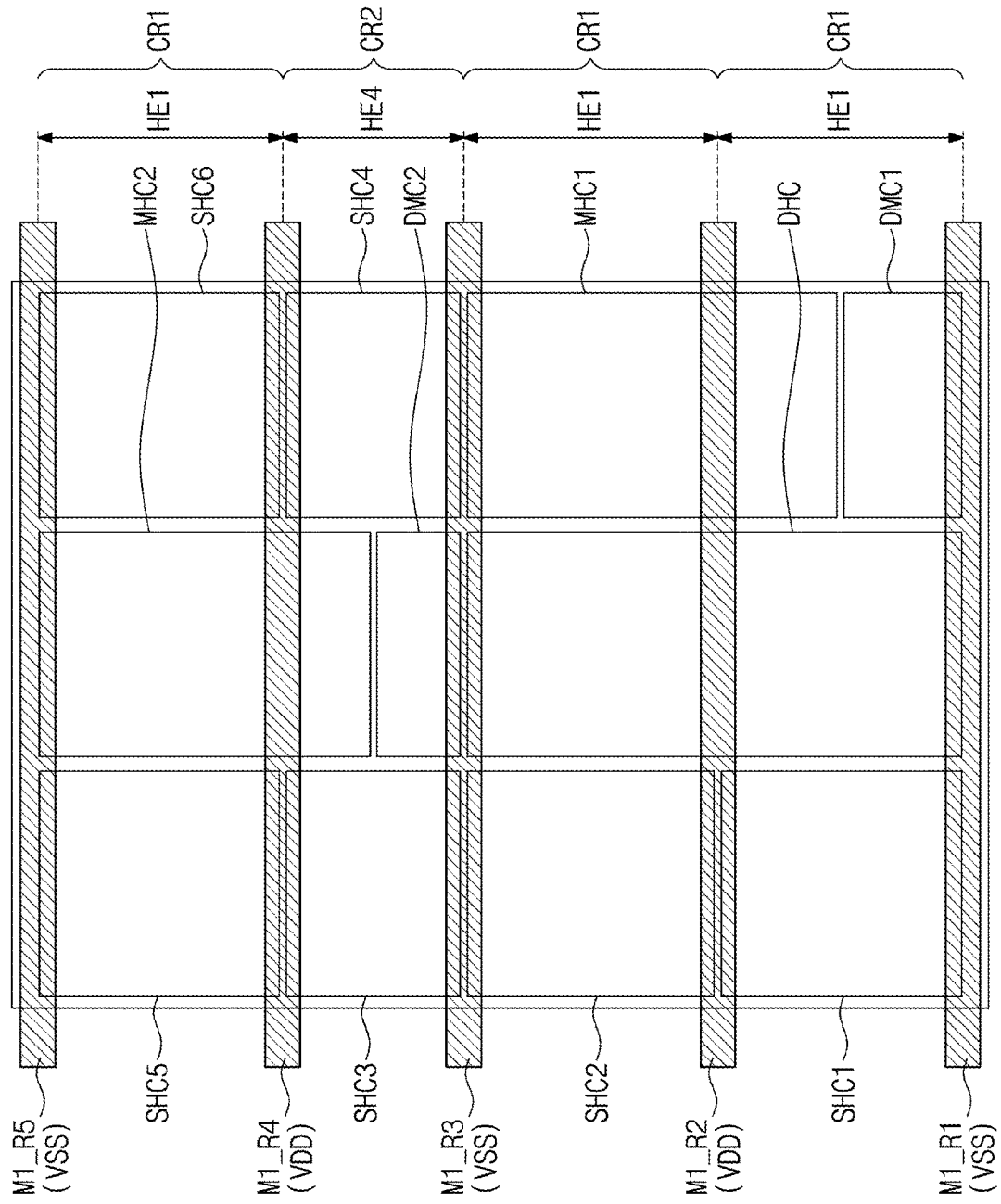

Referring to FIG. 8, first to fifth power lines M1_R1 to M1_R5 may be provided. A first cell block CR1 may be defined between the first and second power lines M1_R1 and M1_R2, between the second and third power lines M1_R2 and M1_R3, and between the fourth and fifth power lines M1_R4 and M1_R5. A second cell block CR2 may be defined between the third and fourth power lines M1_R3 and M1_R4. An interval between the third and fourth power lines M1_R3 and M1_R4 may be less than that between other power lines.

The first cell block CR1 may have a first cell height HE'. The second cell block CR2 may have a fourth cell height HE4 less than the first cell height HE'. The first cell block CR1 may be a zone on which are located logic cells having relatively large cell heights, and the second cell block CR2 may be a zone on which are located logic cells having relatively small cell heights.

The first cell block CR1 between the first and second power lines M1_R1 and M1_R2 may have therein a first single height cell SHC1 and a first filler cell DMC1 whose height is about 0.5× the first cell height HE1. A second single height cell SHC2 may be located in the first cell block CR1 between the second and third power lines M1_R2 and M1_R3.

A double height cell DHC and a first mixed height cell MHC1 may be located between the first and third power lines M1_R1 and M1_R3. The double height cell DHC may occupy all of two neighboring first cell blocks CR1. The first mixed height cell MHC1 and the first filler cell DMC1 may occupy two neighboring first cell blocks CR1.

The second cell block CR2 between the third and fourth power lines M1_R3 and M1_R4 may have therein a third single height cell SHC3, a fourth single height cell SHC4, and a second filler cell DMC2 whose height is about 0.5× the fourth cell height HE4. A fifth single height cell SHC5 and a sixth single height cell SHC6 may be located in the first cell block CR1 between the fourth and fifth power lines M1_R4 and M1_R5.

A second mixed height cell MHC2 may be located between the third and fifth power lines M1_R3 and M1_R5. The second mixed height cell MHC2 and the second filler cell DMC2 may occupy neighboring first and second cell blocks CR1 and CR2. The second mixed height cell MHC2 may have a cell height less than that of the first mixed height cell MHC.

Figure 9:
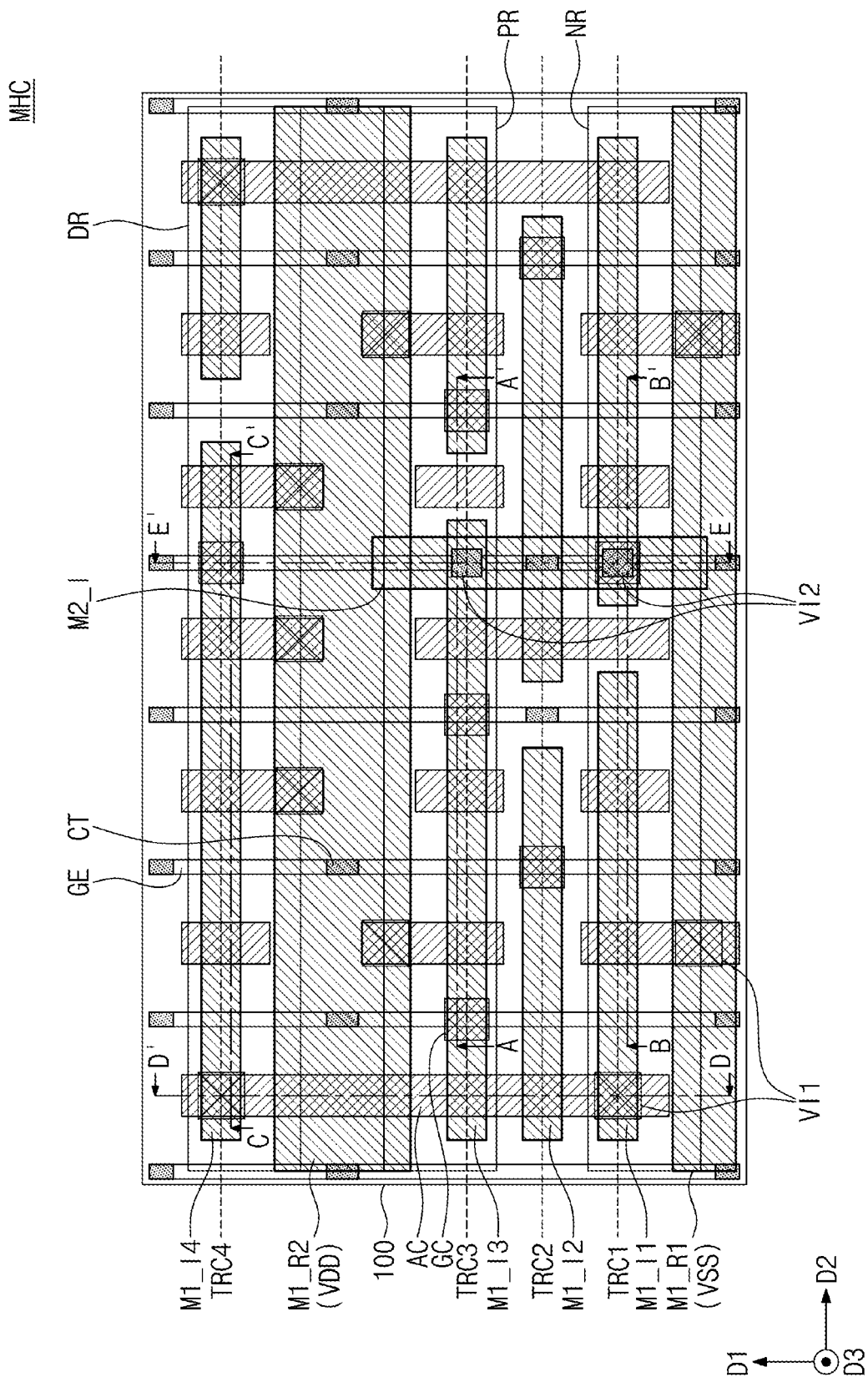
FIG. 9 illustrates a plan view showing a semiconductor device according to some embodiments of the present inventive concepts.
Figure 10A:
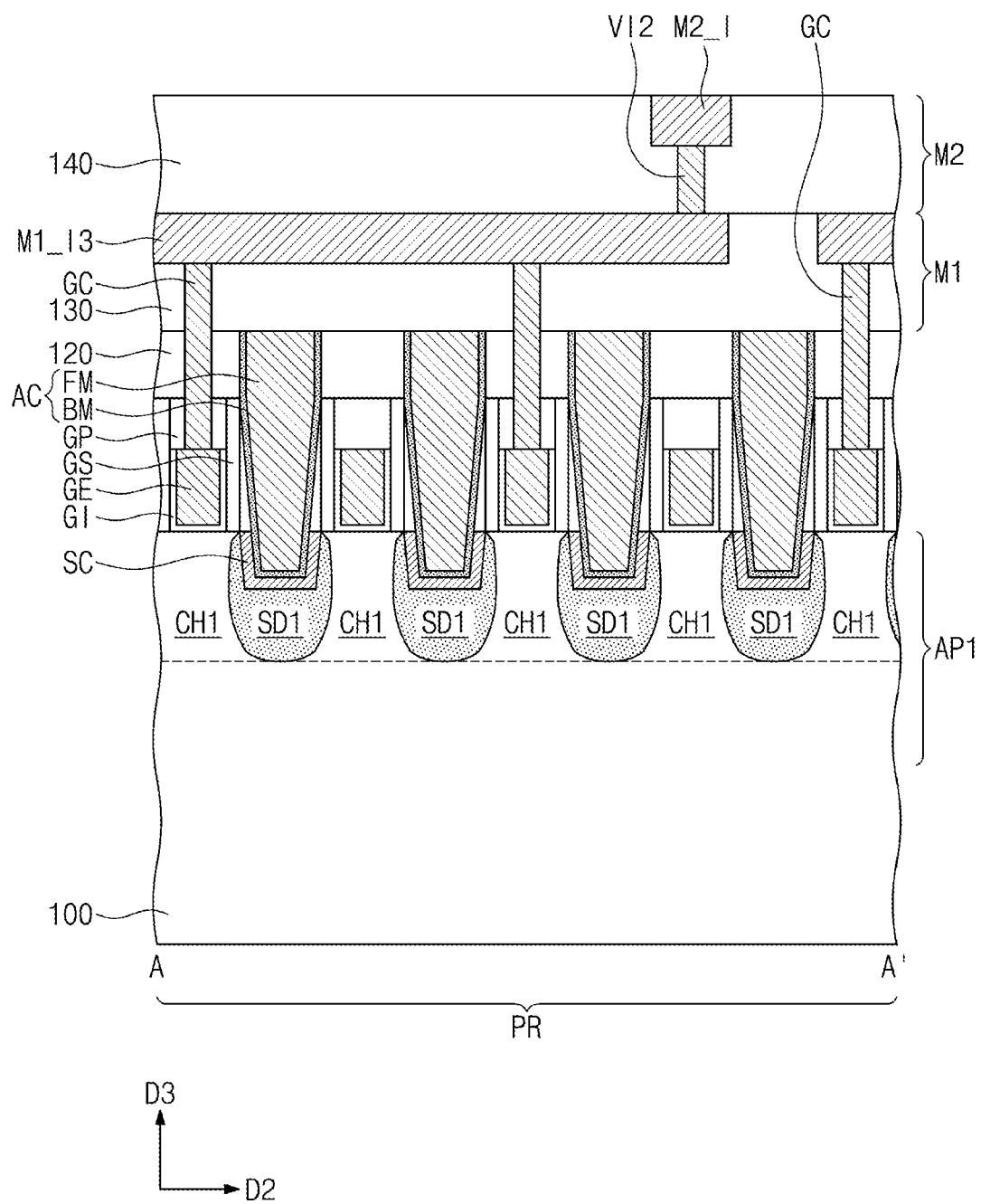
FIGS. 10A, 10B, 10C, 10D, and 10E illustrate cross-sectional views respectively taken along lines A-A', B-B', C-C', D-D', and E-E' of FIG. 9.
Figure 10B:
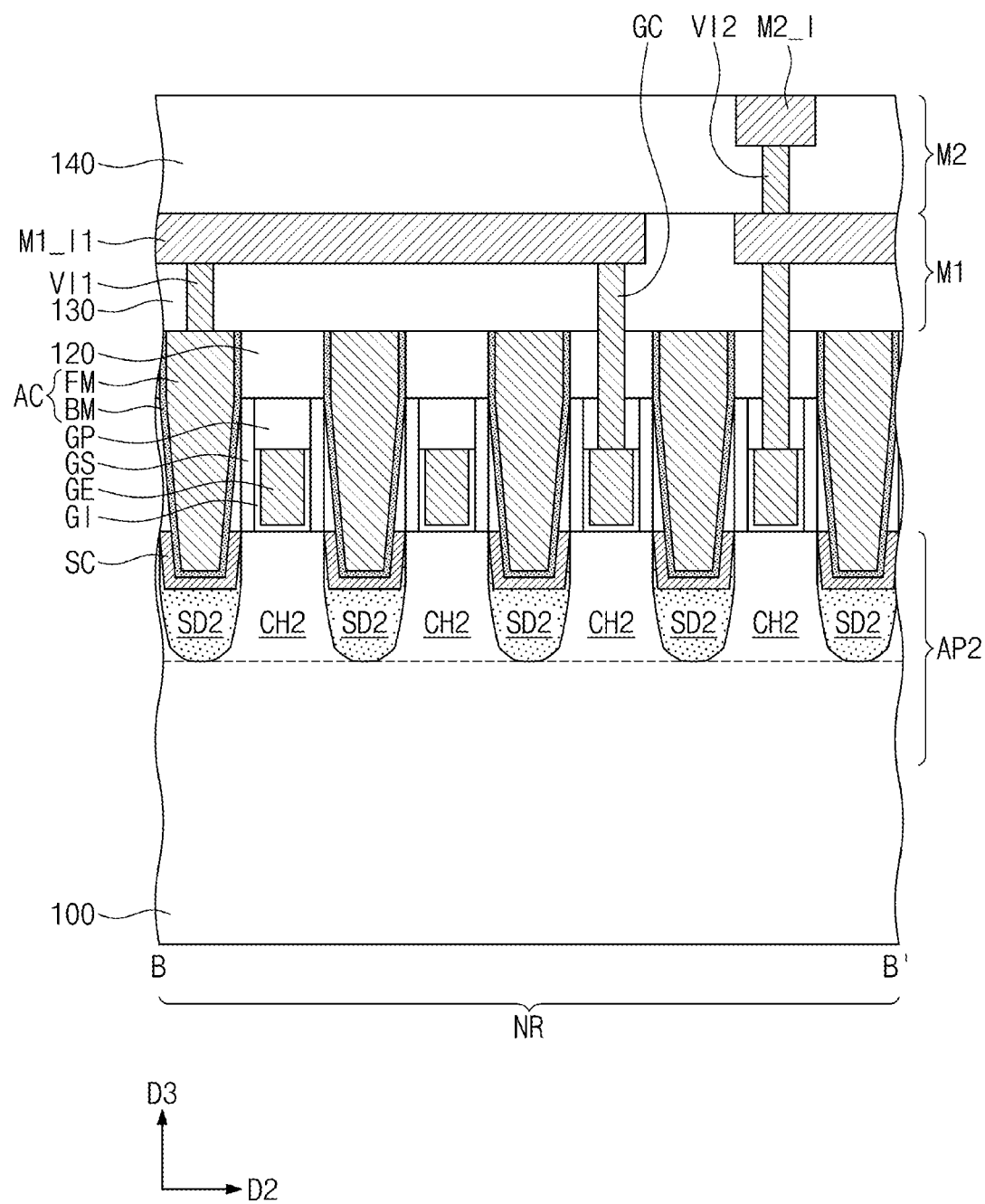
Figure 10C:
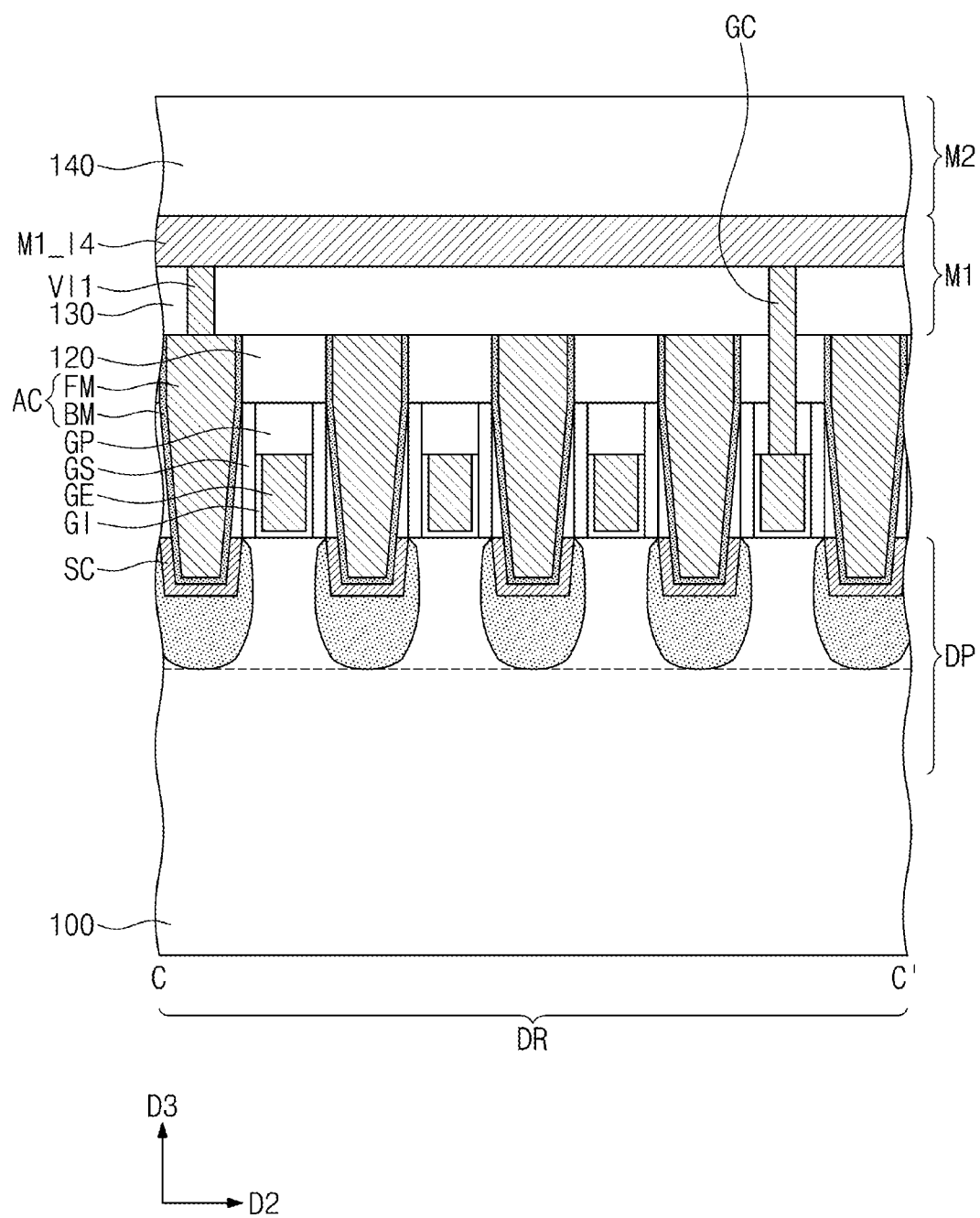
Figure 10D:
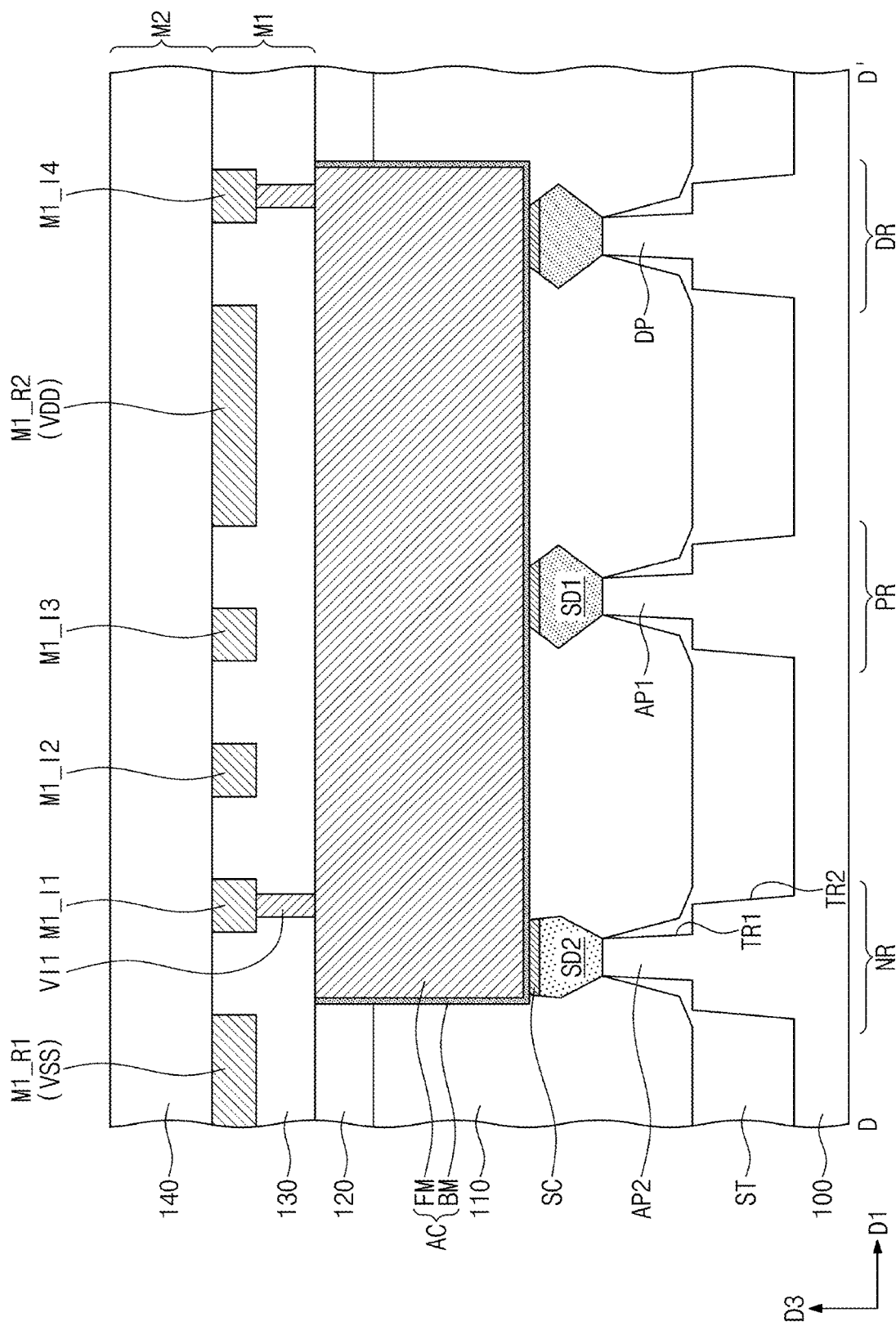
Figure 10E:
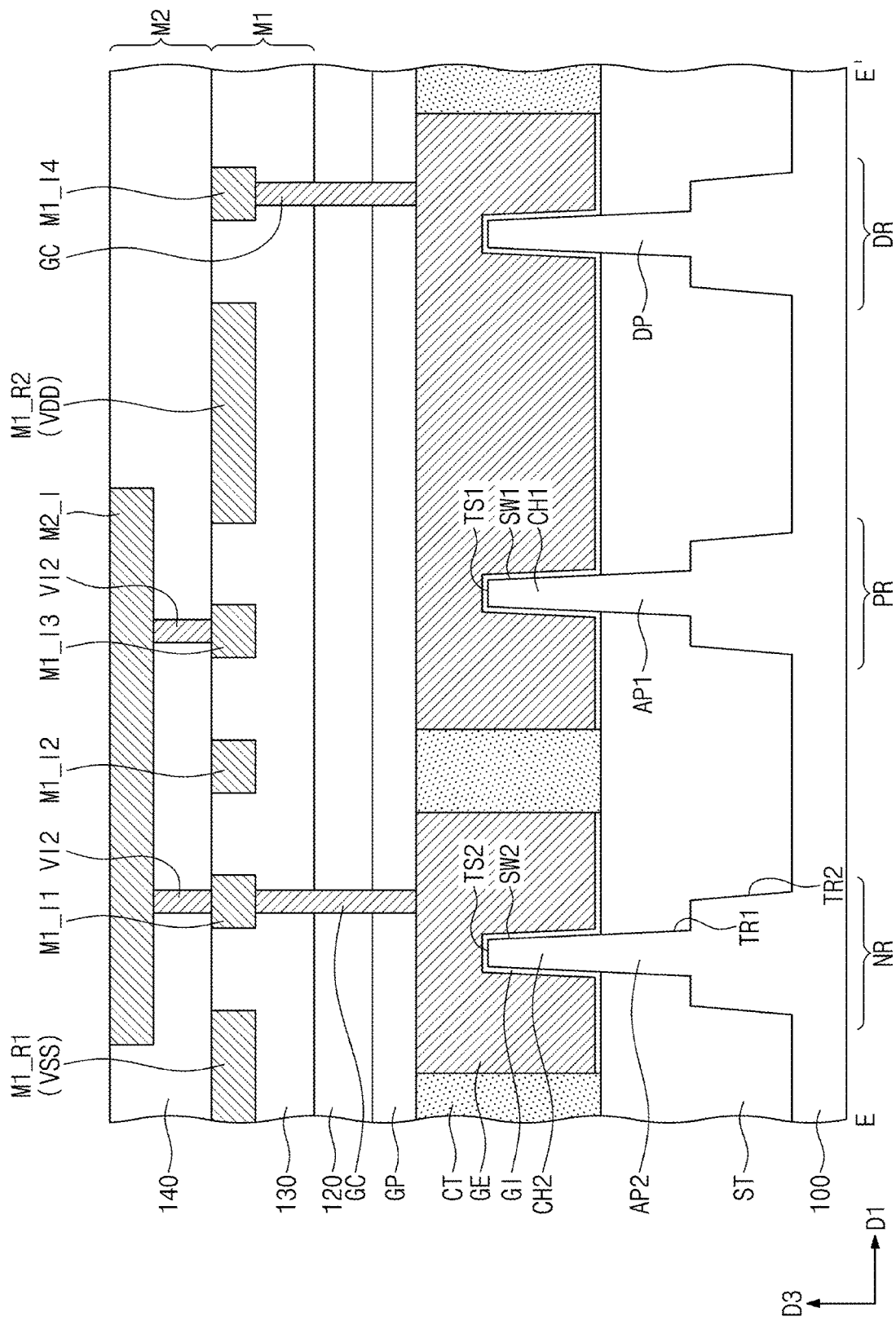

FIG. 9 illustrates a plan view showing a semiconductor device according to some embodiments of the present inventive concepts. FIGS. 10A, 10B, 10C, 10D, and 10E illustrate cross-sectional views respectively taken along lines A-A', B-B', C-C', D-D', and E-E' of FIG. 9. FIG. 9 depicts by way of example a plan view showing an MUX cell of the mixed height cell MHC according to some embodiments of the present inventive concepts. For example, the MUX cell may include a scan mux of a flip-flop.

Referring to FIGS. 9 and 10A to 10E, a substrate 100 may include an NMOSFET region NR, a PMOSFET region PR, and a dummy region DR. The substrate 100 may be a compound semiconductor substrate or a semiconductor substrate including silicon, germanium, or silicon-germanium. For example, the substrate 100 may be a silicon substrate.

The NMOSFET region NR, the PMOSFET region PR, and the dummy region DR may be defined by a second trench TR2 formed on an upper portion of the substrate 100. The NMOSFET region NR and the PMOSFET region PR may be spaced apart in a first direction D1 from each other across the second trench TR2. The PMOSFET region PR and the dummy region DR may be spaced apart in the first direction D1 from each other across the second trench TR2. Each of the NMOSFET region NR, the PMOSFET region PR, and the dummy region DR may extend in a second direction D2 that intersects the first direction D1.

A first active pattern AP1 may be provided on the PMOSFET region PR, and a second active pattern AP2 may be provided on the NMOSFET region NR. A dummy pattern DP may be provided on the dummy region DR.

The first and second active patterns AP1 and AP2 may extend in parallel in the second direction D2. The first and second active patterns AP1 and AP2 may be vertically protruding portions of the substrate 100. A first trench TR1 may define the protruding first and second active patterns AP1 and AP2. The first trench TR1 may be shallower than the second trench TR2. The first trench TR1 may have a slope different from that of the second trench TR2.

A device isolation layer ST may fill the first and second trenches TR1 and TR2. The device isolation layer ST may include a silicon oxide layer. The first and second active patterns AP1 and AP2 may have upper portions that vertically protrude upwards from the device isolation layer ST (see FIG. 10E). Each of the first and second active patterns AP1 and AP2 may have a fin shape at the upper portion thereof. The device isolation layer ST may not cover any of the upper portions of the first and second active patterns AP1 and AP2. The device isolation layer ST may cover lower sidewalls of the first and second active patterns AP1 and AP2.

The first active pattern AP1 may have first source/drain patterns SD1 on the upper portion thereof. The first source/drain patterns SD1 may be impurity regions having a first conductivity type (e.g., p-type). A first channel pattern CH1 may be interposed between a pair of first source/drain patterns SD1. The second active pattern AP2 may have second source/drain patterns SD2 on the upper portion thereof. The second source/drain patterns SD2 may be impurity regions having a second conductivity type (e.g., n-type). A second channel pattern CH2 may be interposed between a pair of second source/drain patterns SD2.

The first and second source/drain patterns SD1 and SD2 may be epitaxial patterns formed by a selective epitaxial growth process. For example, the first and second source/drain patterns SD1 and SD2 may have top surfaces coplanar with those of the first and second channel patterns CH1 and CH2. For another example, the first and second source/drain patterns SD1 and SD2 may have top surfaces higher than those of the first and second channel patterns CH1 and CH2.

The first source/drain patterns SD1 may include a semiconductor element (e.g., SiGe) whose lattice constant is greater than that of a semiconductor element of the substrate 100. Therefore, the first source/drain patterns SD1 may provide the first channel patterns CH1 with compressive stress. For example, the second source/drain patterns SD2 may include the same semiconductor element (e.g., Si) as that of the substrate 100.

Gate electrodes GE may be provided to extend in the first direction D1, while running across the first and second active patterns AP1 and AP2. The gate electrodes GE may be arranged at a regular pitch along the second direction D2 (see FIG. 9). The gate electrodes GE may vertically overlap the first and second channel patterns CH1 and CH2. Each of the gate electrodes GE may surround a top surface and opposite sidewall sidewalls of each of the first and second channel patterns CH1 and CH2.

Referring back to FIG. 10E, the gate electrode GE may be provided on a first top surface TS1 of the first channel pattern CH1 and on at least one first sidewall SW1 of the first channel pattern CH1. The gate electrode GE may be provided on a second top surface TS2 of the second channel pattern CH2 and on at least one second sidewall SW2 of the second channel pattern CH2. For example, a transistor may be a three-dimensional field effect transistor (e.g., FinFET) in which the gate electrode GE three-dimensionally surrounds the first and second channel patterns CH1 and CH2.

Referring back to FIGS. 9 and 10A to 10E, a pair of gate spacers GS may be located on opposite sidewalls of each of the gate electrodes GE. The gate spacer GS may extend in the first direction D1 along the gate electrode GE. The gate spacer GS may have a top surface higher than that of the gate electrode GE. The top surface of the gate spacer GS may be coplanar with that of a first interlayer dielectric layer 110 which will be discussed below. The gate spacer GS may include at least one selected from silicon carbonitride (SiCN), silicon carbon oxynitride (SiCON), and silicon nitride (SiN). Alternatively, the gate spacer GS may include a multi-layer formed of at least two selected from SiCN, SiCON, and SiN.

A gate capping pattern GP may be provided on each of the gate electrodes GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from silicon oxynitride (SiON), SiCN, SiCON, and SiN.

A gate dielectric layer GI may be interposed between the gate electrode GE and the first active pattern AP1 and between the gate electrode GE and the second active pattern AP2. The gate dielectric layer GI may extend along a bottom surface of the gate electrode GE that overlies the gate dielectric layer GI. For example, the gate dielectric layer GI may cover the first top surface TS1 and the first sidewall SW1 of the first channel pattern CH1. The gate dielectric layer GI may cover the second top surface TS2 and the second sidewall SW2 of the second channel pattern CH2. The gate dielectric layer GI may cover a top surface of the device isolation layer ST that underlies the gate electrode GE (see FIG. 10E).

In some embodiments of the present inventive concepts, the gate dielectric layer GI may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some embodiments, a semiconductor device according to the present inventive concepts may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 millivolts (mV)/decade at room temperature.

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A kind of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In some embodiments, the ratio of impurities may be a ratio of aluminum to the sum of hafnium and aluminum.

When the impurities are silicon (Si), the ferroelectric material layer may include about 2 to 10 atomic percent silicon. When the impurities are yttrium (Y), the ferroelectric material layer may include about 2 to 10 atomic percent yttrium. When the impurities are gadolinium (Gd), the ferroelectric material layer may include about 1 to 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but the present inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm. Because ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric layers that are spaced apart from each other. The gate dielectric layer GI may have a stack structure in which a plurality of ferroelectric material layers are alternately stacked with a plurality of paraelectric material layers.

The gate electrode GE may include a first metal pattern and a second metal pattern on the first metal pattern. The first metal pattern may be provided on the gate dielectric layer GI and may be adjacent to the first and second channel patterns CH1 and CH2. The first metal pattern may include a work-function metal that controls a threshold voltage of a transistor. A thickness and composition of the first metal pattern may be adjusted to achieve a desired threshold voltage.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). The first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta).

Referring again to FIG. 10E, cutting patterns CT may be provided on opposite ends of the gate electrode GE. The cutting pattern CT may divide the gate electrode GE that extends in the first direction D1 into a plurality of gate electrodes. For example, the cutting pattern CT may be interposed between the gate electrodes GE that are adjacent to each other in the first direction D1. The cutting pattern CT may include a dielectric material, such as a silicon oxide layer and/or a silicon nitride layer.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 that covers the gate capping patterns GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

Active contacts AC may be provided to penetrate the first and second interlayer dielectric layers 110 and 120 and to have electrical connection with the first and second source/drain patterns SD1 and SD2. The active contacts AC may be provided between the gate electrodes GE.

Each of the active contacts AC may have a bar or linear shape that extends in the first direction D1. One of the active contacts AC may be provided only on the first source/drain pattern SD1. Another of the active contacts AC may be provided only on the second source/drain pattern SD2. Still another of the active contacts AC may extend in the first direction D1 to connect the first source/drain pattern SD1 to the second source/drain pattern SD2.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected through the silicide pattern SC to the first and second source/drain patterns SD1 and SD2. The silicide pattern SC may include metal silicide, for example, at least one selected from titanium silicide, tantalum silicide, tungsten silicide, nickel silicide, and cobalt silicide.

The active contact AC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in the third interlayer dielectric layer 130. The first metal layer M1 of the mixed height cell MHC may include a first power line M1_R1, a second power line M1_R2, first, second, and third lower lines M1_I1, M1_I2, and M1_I3 between the first power line M1_R1 and the second power line M1_R2, and a fourth lower line M1_I4 on the dummy region DR.

Each of the first and second power lines M1_R1 and M1_R2 may extend in the second direction D2, while running across the mixed height cell MHC. The first to fourth lower lines M1_I1 to M1_I4 may be located aligned with the first to fourth line tracks TRC1 to TRC4, respectively. The first to fourth lower lines M1_I1 to M1_I4 may have a linear or bar shape that extends in the second direction D2.

In comparison with a single height cell, the mixed height cell MHC according to some embodiments may additionally include the dummy region DR, and thus it may be possible to securely obtain not only the first, second, and third lower lines M1_I1, M1_I2, and M1_I3, but also the fourth lower line M1_I4.

Gate contacts GC may be provided to extend toward the gate electrodes GE from the first to fourth lower lines M1_I1 to M1_I4, thereby having electrical connection with the gate electrodes GE. The gate contacts GC may penetrate the second and third interlayer dielectric layers 120 and 130 and the gate capping pattern GP.

The first metal layer M1 may further include first vias VI1. Each of the first vias may be provided below a wiring line of the first metal layer M1. For example, the first via VI1 may be interposed between the active contact AC and one of the first to fourth lower lines M1_I1 to M1_I4, and thus may electrically connect the active contact AC to the one of the first to fourth lower lines M1_I1 to M1_I4. The first via VI1 may be interposed between the active contact AC and one of the first and second power lines M1_R1 and M1_R2, and thus may electrically connect the active contact AC to the one of the first and second power lines M1_R1 and M1_R2.

For example, a certain line and its underlying first via VI1 of the first metal layer M1 may be formed by individual processes. A certain line of the first metal layer M1 and its underlying gate contact GC may be formed by individual processes. For example, the certain line of the first metal layer M1, the first via VI1, and the gate contact GC may each be formed by a single damascene process. A sub-20 nanometer (nm) process may be employed to fabricate a semiconductor device according to the some embodiments.

A second metal layer M2 may be provided in the fourth interlayer dielectric layer 140. The second metal layer M2 may include at least one upper line M2_I. The upper line M2_I of the second metal layer M2 may have a linear or bar shape that extends in the first direction D1.

The second metal layer M2 may further include a second via VI2. The second via VI2 may be provided below the upper line M2_I. For example, the upper line M2_I may be electrically connected through the second via VI2 to its underlying one of the first, second, third, and fourth lower lines M1_I1, M1_I2, M1_I3, and M1_I4.

The upper line M2_I of the second metal layer M2 and its underlying second via VI2 may be formed at the same time in a single process. For example, a dual damascene process may be employed to simultaneously form the upper via VI2 and the upper line M2_I of the second metal layer M2.

The first and second metal layers M1 and M2 may have lines that include the same or different conductive materials. For example, the first and second metal layers M1 and M2 may have lines that include at least one metallic material selected from aluminum, copper, tungsten, molybdenum, and cobalt.

Although not shown, additional upper lines M2_I may further be provided in the second metal layer M2. The additional upper lines M2_I may include routing lines that connect the mixed height cell MHC to another logic cells.

Although not shown, the fourth interlayer dielectric layer 140 may be additionally provided thereon with stacked metal layers (e.g., third, fourth, fifth, sixth, and/or seventh metal layers). Each of the stacked metal layers may include lines for routing.

Figure 11:
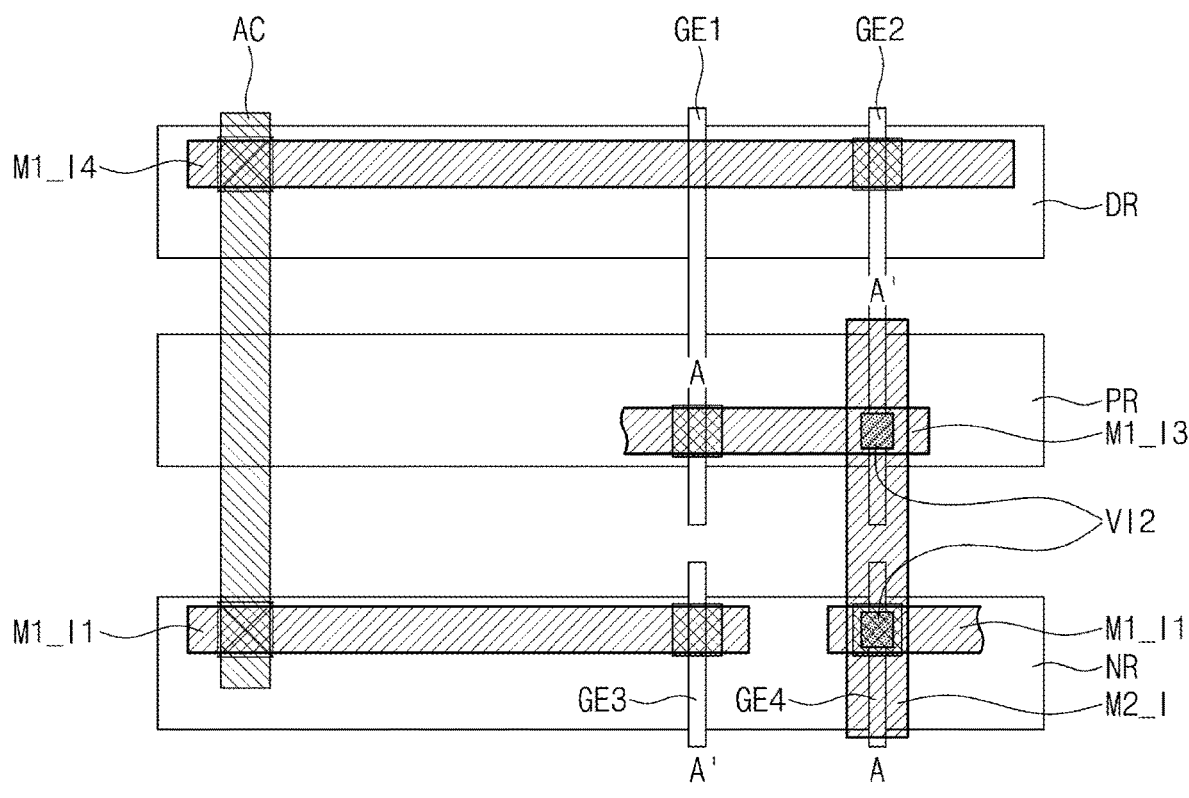
FIG. 11 illustrates a plan view showing a cross-coupled structure of a mixed height cell depicted in FIG. 9.
Figure 12A:
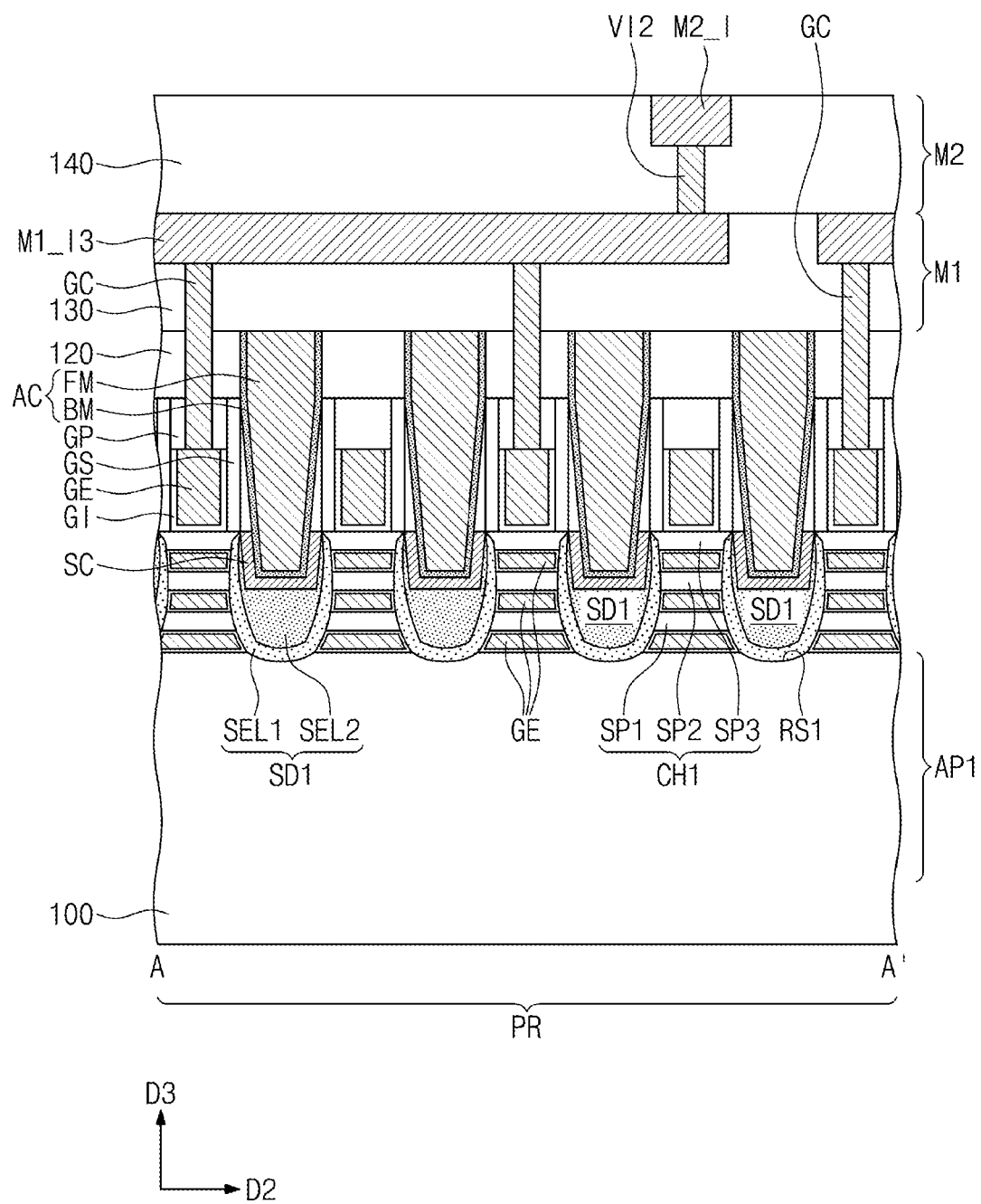
FIGS. 12A, 12B, 12C, 12D, and 12E illustrate cross-sectional views respectively taken along lines A-A', B-B', C-C', D-D', and E-E' of FIG. 9, showing a semiconductor device according to some embodiments of the present inventive concepts.
Figure 12B:
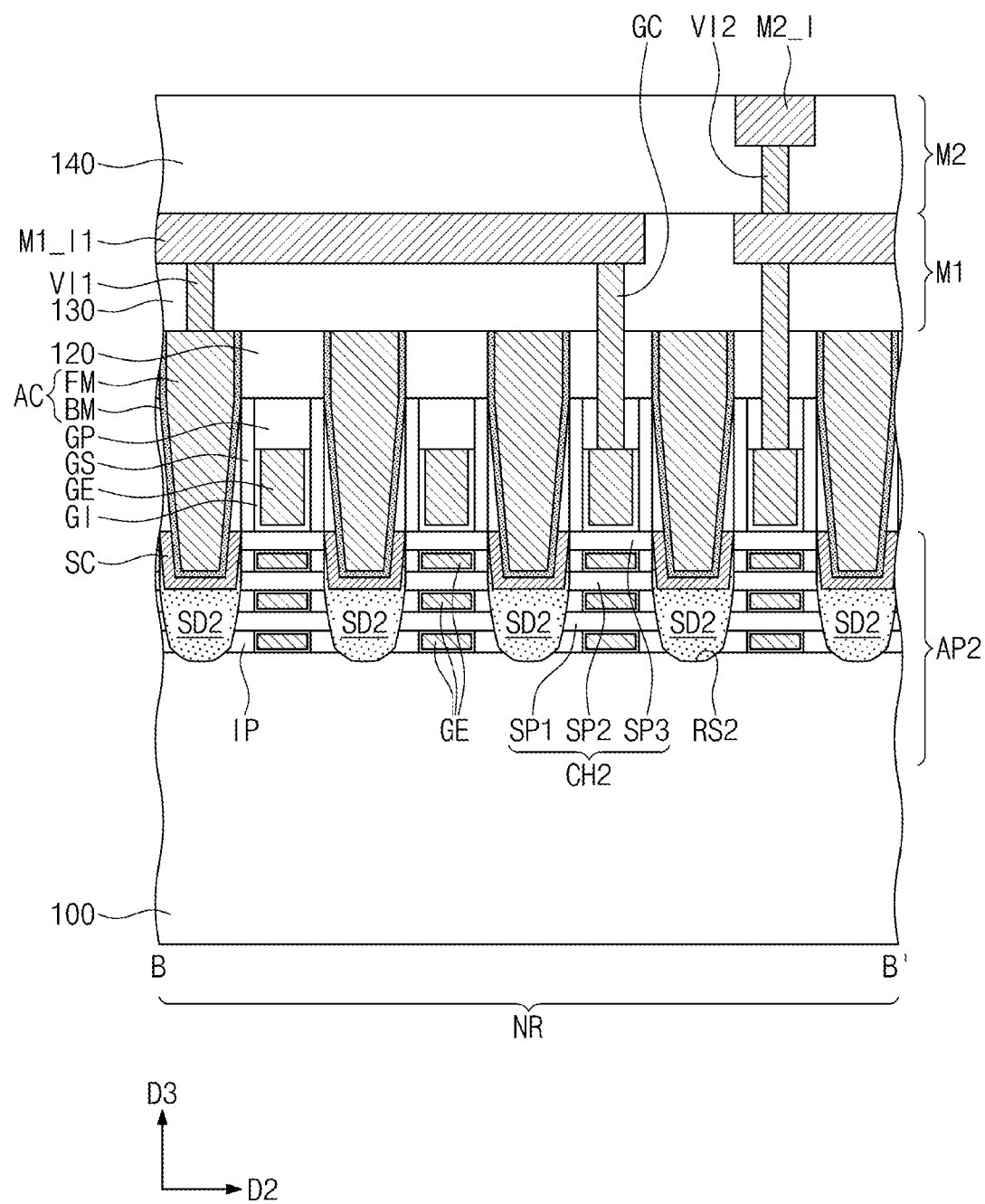
Figure 12C:
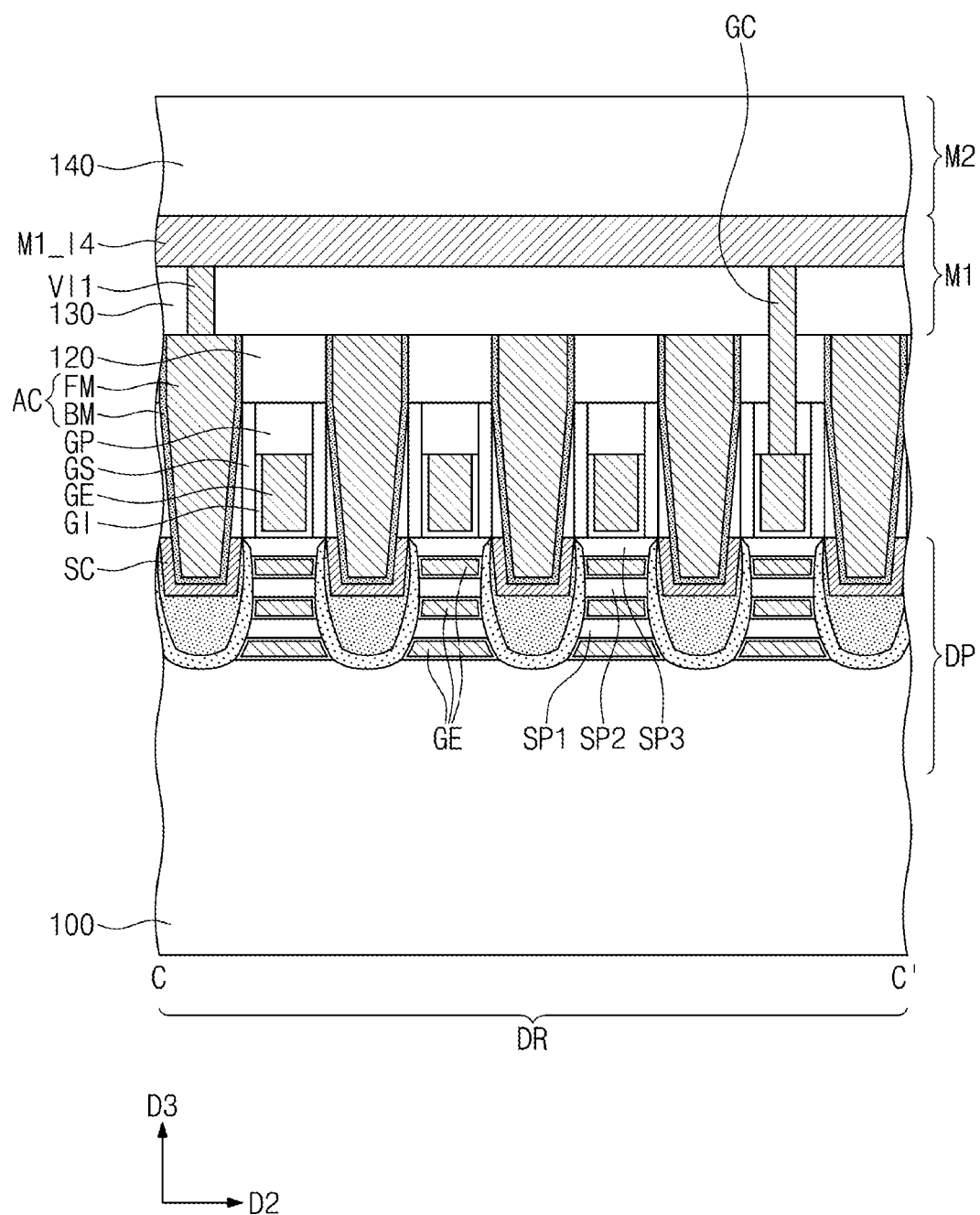
Figure 12D:
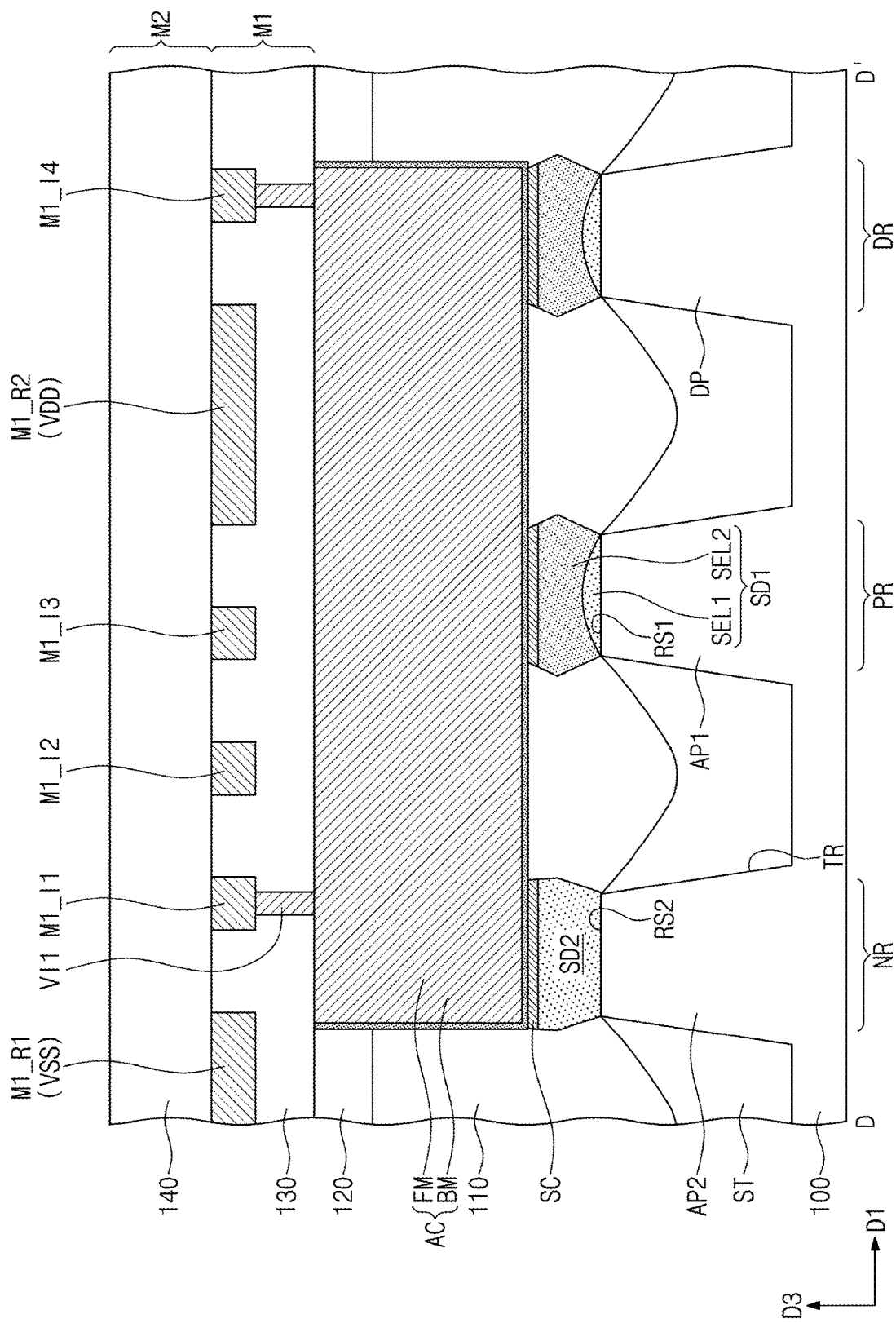
Figure 12E:
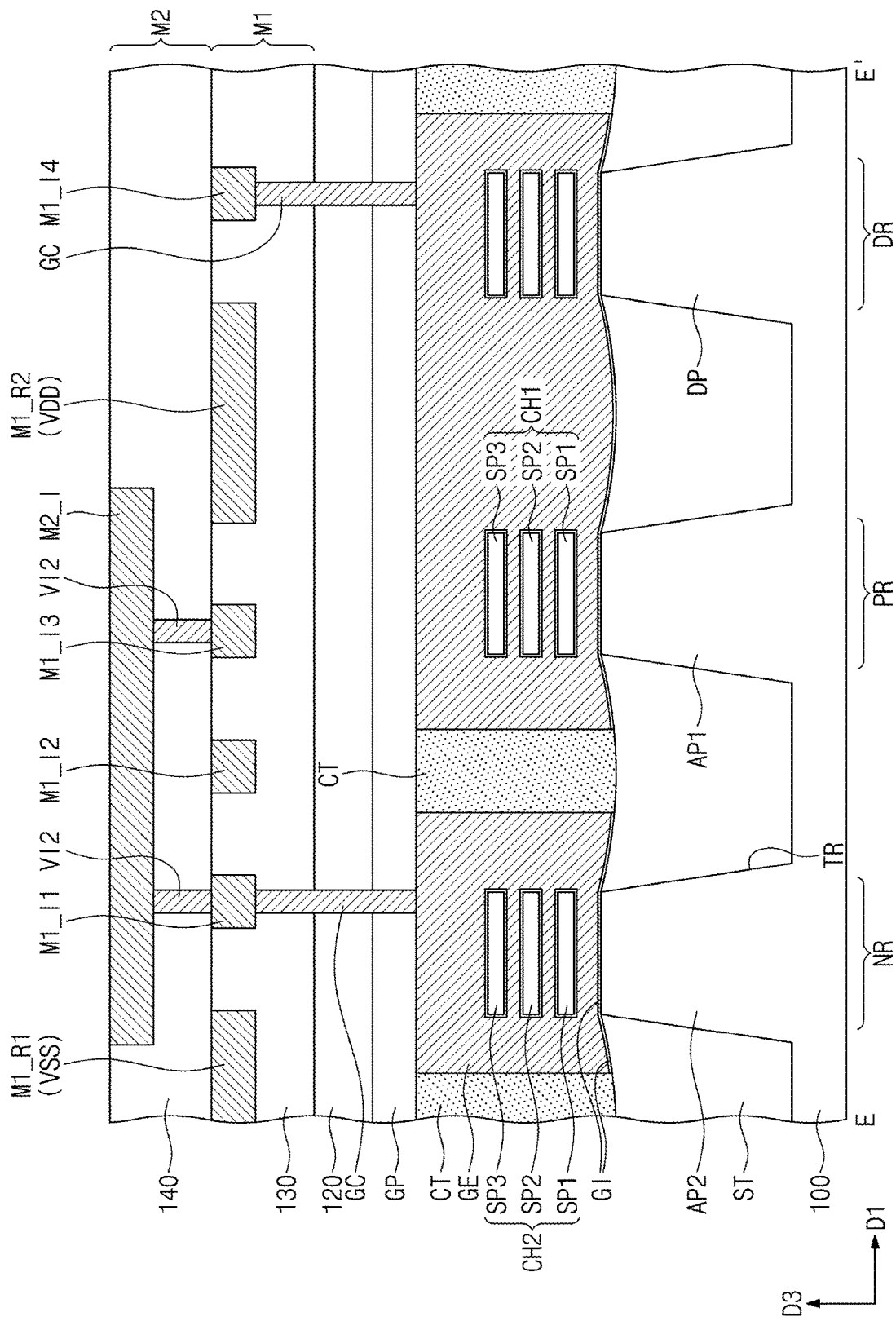

FIG. 11 illustrates a plan view showing a cross-coupled structure of the mixed height cell depicted in FIG. 9. Referring to FIG. 11, an MUX cell according to some embodiments of the present inventive concepts may include first to fourth gate electrodes GE1 to GE4. The first and second gate electrodes GE1 and GE2 may be provided on the PMOSFET region PR and may be adjacent to each other in the second direction D2. The third and fourth gate electrodes GE3 and GE4 may be provided on the NMOSFET region NR and may be adjacent to each other in the second direction D2.

The first and third gate electrodes GE1 and GE3 may be aligned with each other in the first direction D1. The first and third gate electrodes GE1 and GE3 may have therebetween the cutting pattern CT discussed above. The second and fourth gate electrodes GE2 and GE4 may be aligned with each other in the first direction D1. The second and fourth gate electrodes GE2 and GE4 may have therebetween the cutting pattern CT discussed above.

A first signal A may be applied to the first gate electrode GE1. The first signal A may be applied to the fourth gate electrode GE4. A second signal A' may be applied to the second gate electrode GE2. The second signal A' may be applied to the third gate electrode GE3. The second signal A' may be an inverted signal of the first signal A.

For example, the first gate electrode GE1 may be electrically connected to the third lower line M1_I3 that overlies the first gate electrode GE1, and the fourth gate electrode GE4 may be electrically connected to the first lower line M1_I1 that overlies the fourth gate electrode GE4. The first lower line M1_I1 and the third lower line M1_I3 may be electrically connected to each other through the upper line M2_I. As a result, the first gate electrode GE1 and the fourth gate electrode GE4 may be connected in common to each other, and the first signal A may be applied in common to the first and fourth gate electrodes GE1 and GE4.

The third gate electrode GE3 may be electrically connected to the first lower line M1_I1 that overlies the third gate electrode GE3, and the second gate electrode GE2 may extend toward the dummy region DR to have electrical connection with the fourth lower line M1_I4. The first lower line M1_I1 and the fourth lower line M1_I4 may be electrically connected to each other through the active contact AC that extends in the first direction D1. As a result, the second gate electrode GE2 and the third gate electrode GE3 may be connected in common to each other, and the second signal A' may be applied in common to the second and third gate electrodes GE2 and GE3.

In some embodiments of the present inventive concepts, when the mixed height cell MHC of FIG. 9 is a scan MUX of a flip-flop, the first signal A may be a scan enable (SE) signal, and the second signal A' may be an inverted scan enable (/SE) signal.

In some embodiments of the present inventive concepts, when the mixed height cell MHC of FIG. 9 is a master latch or slave latch of a flip-flop, the first signal A may be a clock (CLK) signal, and the second signal A' may be an inverted clock (/CLK) signal.

The mixed height cell MHC of FIGS. 9 and 11 may additionally include the fourth lower line M1_I4 on the dummy region DR, and may thus achieve a cross-coupled structure that includes the first to fourth gate electrodes GE1 to GE4. For example, even when there is no adoption of a structure of the double height cell DHC depicted in FIG. 2 for an increase in the number of lower lines, the mixed height cell MHC of FIGS. 9 and 11 may achieve a cross-coupled structure.

FIGS. 12A, 12B, 12C, 12D, and 12E illustrate cross-sectional views respectively taken along lines A-A', B-B', C-C', D-D', and E-E' of FIG. 9, showing a semiconductor device according to some embodiments of the present inventive concepts. In the discussion that follows, a detailed description of technical features repetitive to those discussed above with reference to FIGS. 9 and 10A to 10E may be omitted, and a difference thereof will be discussed in detail.

Referring to FIGS. 9 and 12A to 12E, a substrate 100 may be provided which includes a PMOSFET region PR, an NMOSFET region NR, and a dummy region DR. A device isolation layer ST may be provided on the substrate 100. The device isolation layer ST may define a first active pattern AP1, a second active pattern AP2, and a dummy pattern DP on an upper portion of the substrate 100. The first active pattern AP1 may be defined on the PMOSFET region PR, and the second active pattern AP2 may be defined on the NMOSFET region NR.

The first active pattern AP1 may include a first channel pattern CH1 on an upper portion thereof. The second active pattern AP2 may include a second channel pattern CH2 on an upper portion thereof. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction or a third direction D3.

Each of the first, second, and third semiconductor patterns SP1, SP2, and SP3 may include silicon (Si), germanium (Ge), or silicon-germanium (SiGe). For example, each of the first, second, and third semiconductor patterns SP1, SP2, and SP3 may include crystalline silicon.

The first active pattern AP1 may further include first source/drain patterns SD1. The first source/drain patterns SD1 may be provided in corresponding first recesses RS1 formed on the upper portion of the first active pattern AP1. A pair of neighboring first source/drain patterns SD1 may have therebetween the stacked first, second, and third semiconductor patterns SP1, SP2, and SP3 of the first channel pattern CH1. The stacked first, second, and third semiconductor patterns SP1, SP2, and SP3 may connect the pair of neighboring first source/drain patterns SD1 to each other.

Each of the first source/drain patterns SD1 may include a first semiconductor layer SEL1 and a second semiconductor layer SEL2 on the first semiconductor layer SEL1. The first semiconductor layer SEL1 may cover an inner wall of the first recess RS1. The first semiconductor layer SEL1 may be shaped like U along a profile of the first recess RS1. The second semiconductor layer SEL2 may fill a remaining portion of the first recess RS1 that is filled with the first semiconductor layer SEL1. The second semiconductor layer SEL2 may have a volume greater than that of the first semiconductor layer SEL1.

Each of the first and second semiconductor layers SEL1 and SEL2 may include silicon-germanium (SiGe). For example, the first semiconductor layer SEL1 may contain germanium (Ge) whose concentration is relatively low. In some embodiments of the present inventive concepts, the first semiconductor layer SEL1 may include only silicon (Si) and not germanium (Ge). The first semiconductor layer SEL1 may have a germanium concentration of about 0 at % to about 10 at %.

The second semiconductor layer SEL2 may contain germanium (Ge) whose concentration is relatively high. For example, the second semiconductor layer SEL2 may have a germanium (Ge) concentration of about 30 at % to about 75 at %. The germanium concentration of the second semiconductor layer SEL2 may increase in the third direction D3. For example, the second semiconductor layer SEL2 adjacent to the first semiconductor layer SEL1 may have a germanium concentration of about 40 at %, but an upper portion of the second semiconductor layer SEL2 may have a germanium concentration of about 60 at %.

The first and second semiconductor layers SEL1 and SEL2 may include impurities (e.g., boron) that cause the first source/drain pattern S131 to have a p-type conductivity type. An impurity concentration (e.g., atomic percent) of the second semiconductor layer SEL2 may be greater than that of the first semiconductor layer SEL1. The first semiconductor layer SEL1 may reduce/prevent stacking faults between the substrate 100 and the second semiconductor layer SEL2 and between the second semiconductor layer SEL2 and the first, second, and third semiconductor patterns SP1, SP2, and SP3.

The second active pattern AP2 may further include second source/drain patterns SD2. The second source/drain patterns SD2 may be provided in corresponding second recesses RS2 formed on the upper portion of the second active pattern AP2. A pair of neighboring second source/drain patterns SD2 may have therebetween the stacked first, second, and third semiconductor patterns SP1, SP2, and SP3 of the second channel pattern CH2. The stacked first, second, and third semiconductor patterns SP1, SP2, and SP3 may connect the pair of neighboring second source/drain patterns SD2 to each other.

Gate electrodes GE may be provided to extend in a first direction D1, while running across the first and second channel patterns CH1 and CH2. The gate electrode GE may vertically overlap the first and second channel patterns CH1 and CH2. A pair of gate spacers GS may be located on opposite sidewalls of the gate electrode GE. A gate capping pattern GP may be provided on the gate electrode GE.

Referring back to FIG. 12E, the gate electrode GE may surround the first, second, and third semiconductor patterns SP1, SP2, and SP3 of each of the first and second channel patterns CH1 and CH2. A transistor according to some embodiments may thus be a three-dimensional field effect transistor (e.g. MBCFET or GAAFET) in which the gate electrode GE three-dimensionally surrounds the first and second channel patterns CH1 and CH2.

A gate dielectric layer GI may be provided between the gate electrode GE and each of the first, second, and third semiconductor patterns SP1, SP2, and SP3. The gate dielectric layer GI may surround each of the first and second channel patterns CH1 and CH2.

On the NMOSFET regions NR, an inner spacer IP may be interposed between the gate dielectric layer GI and the second source/drain pattern SD2. The gate dielectric layer GI and the inner spacer IP may separate the gate electrode GE from the second source/drain pattern SD2. In contrast, the inner spacer IP may be omitted from the PMOSFET regions PR.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to correspondingly have connection with the first and second source/drain patterns SD1 and SD2. Gate contacts GC may be provided to penetrate the second interlayer dielectric layer 120 and the gate capping pattern GP and to have connection with corresponding gate electrodes GE. A detailed description of the active contacts AC and the gate contacts GC may be substantially the same as that discussed above with reference to FIGS. 9 and 10A to 10E.

A third interlayer dielectric layer 130 may be provided on the second interlayer dielectric layer 120. A fourth interlayer dielectric layer 140 may be provided on the third interlayer dielectric layer 130. A first metal layer M1 may be provided in the third interlayer dielectric layer 130. A second metal layer M2 may be provided in the fourth interlayer dielectric layer 140. A detailed description of the first metal layer M1 and the second metal layer M2 may be substantially the same as that discussed above with reference to FIGS. 9 and 10A to 10E.

FIGS. 13 to 17 illustrate plan views showing a semiconductor device according to some embodiments of the present inventive concepts. FIGS. 13 to 17 depict modifications of the mixed height cell MHC of FIG. 9. In the discussion that follows, a detailed description of technical features repetitive to those discussed above with reference to FIGS. 9 and 10A to 10E may be omitted, and a difference thereof will be discussed in detail.

Figure 13:
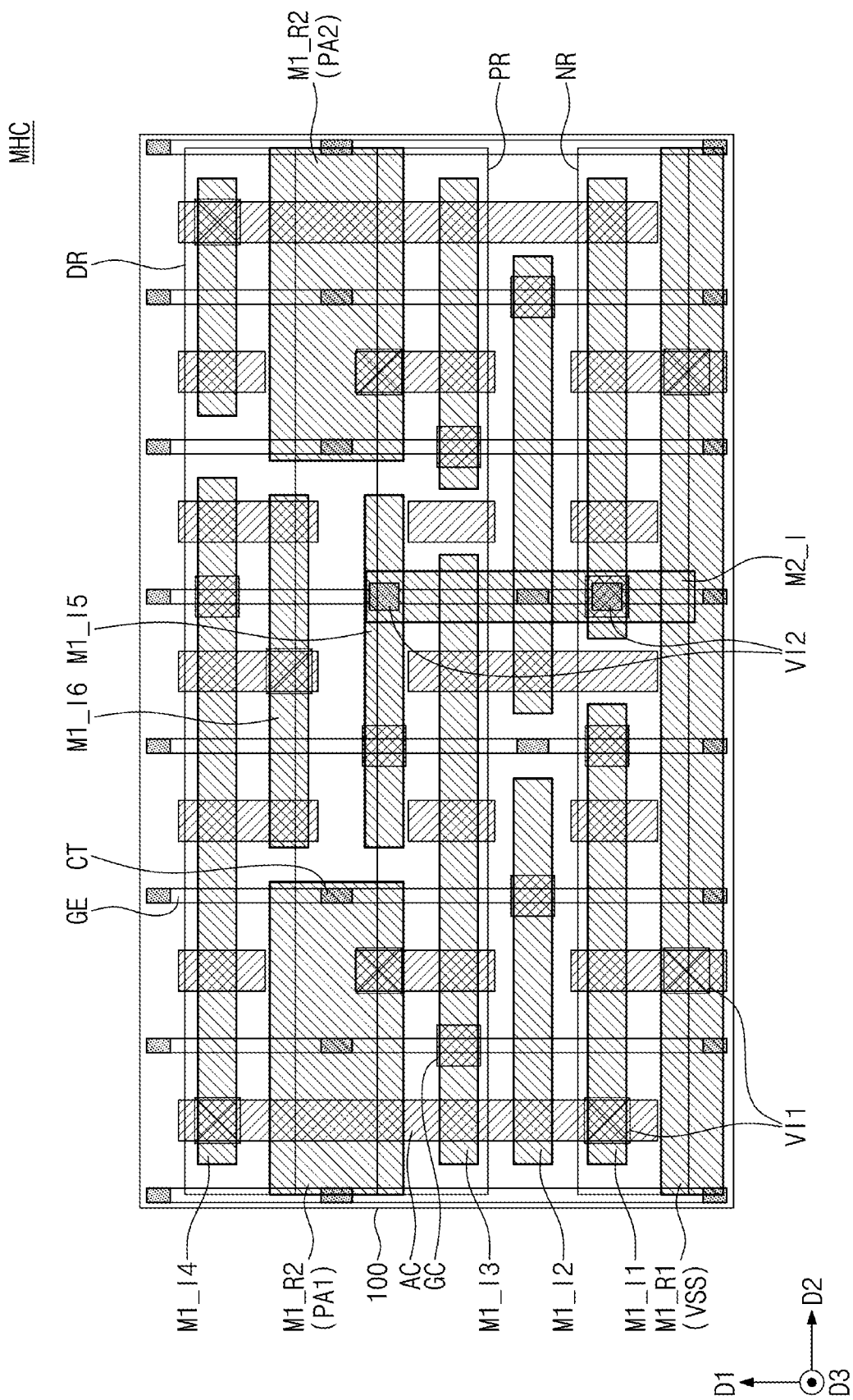
FIGS. 13 to 17 illustrate plan views showing a semiconductor device according to some embodiments of the present inventive concepts.

Referring to FIG. 13, the second power line M1_R2 may include a first part PA1 and a second part PA2. The first part PA1 and the second part PA2 may be spaced apart from each other in the second direction D2. A fifth lower line M1_I5 and a sixth lower line M1_I6 may be located between the first part PA1 and the second part PA2. The fifth and sixth lower lines M1_I5 and M1_I6 may be located adjacent to each other in the first direction D1. The fifth and sixth lower lines M1_I5 and M1_I6 may be used as signal lines together with the first to fourth lower lines M1_I1 to M1_I4. As the fifth and sixth lower lines M1_I5 and M1_I6 are added, it may be possible to increase the number of signal lines and the degree of freedom of routing.

Figure 14:
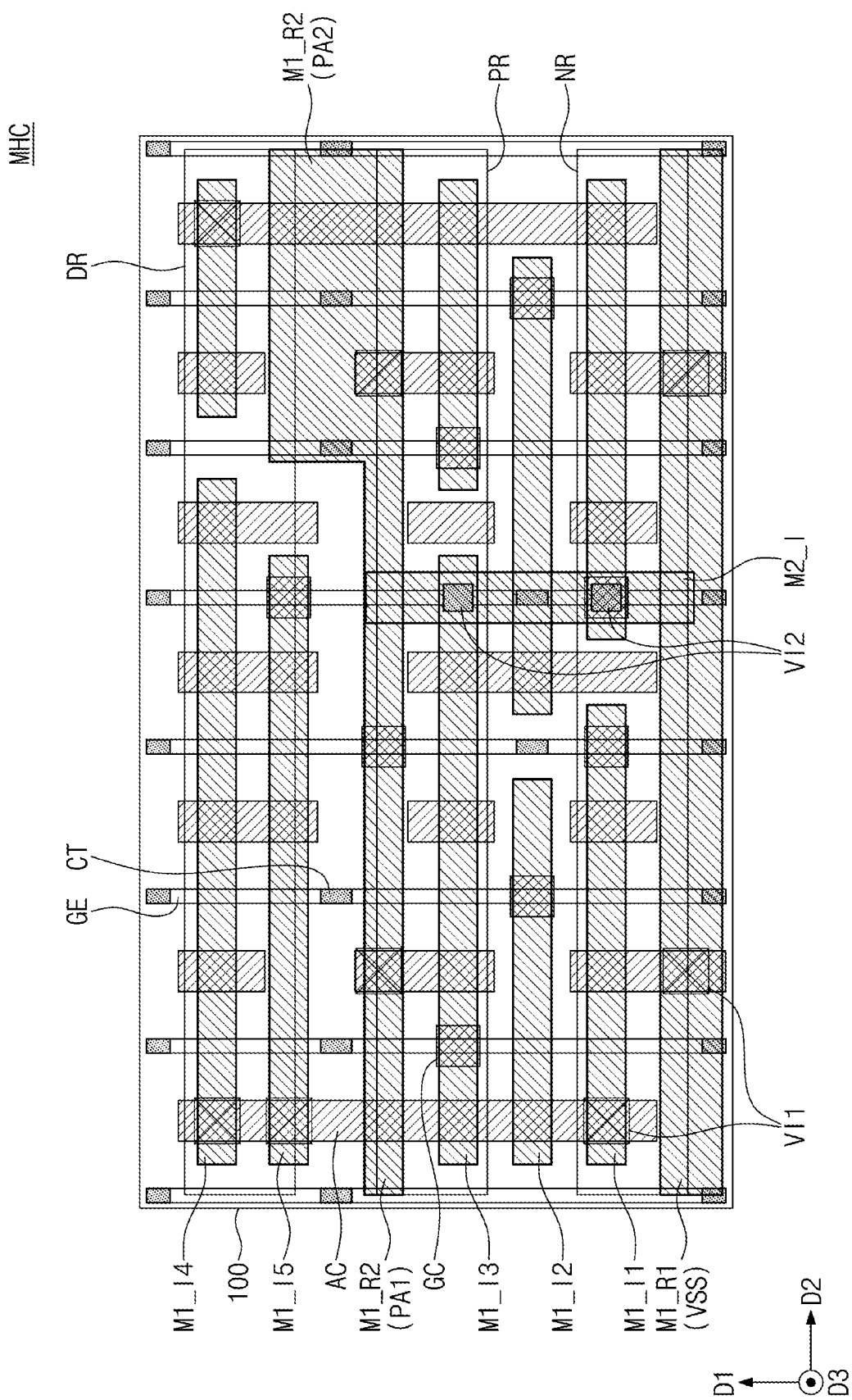

Referring to FIG. 14, the second power line M1_R2 may include a first part PA1 and a second part PA2. The first part PA1 may have a line-width less than that of the second part PA2. The first part PA1 and the second part PA2 may be connected to each other, and thus the second power line M1_R2 may have an L shape.

A fifth lower line M1_I5 may be located adjacent to the first part PA1 of the second power line M1_R2. The fifth lower line M1_I5 may be used as a signal line together with the first to fourth lower lines M1_I1 to M1_I4. As the fifth lower line M1_I5 is added, it may be possible to increase the number of signal lines and the degree of freedom of routing.

Figure 15:
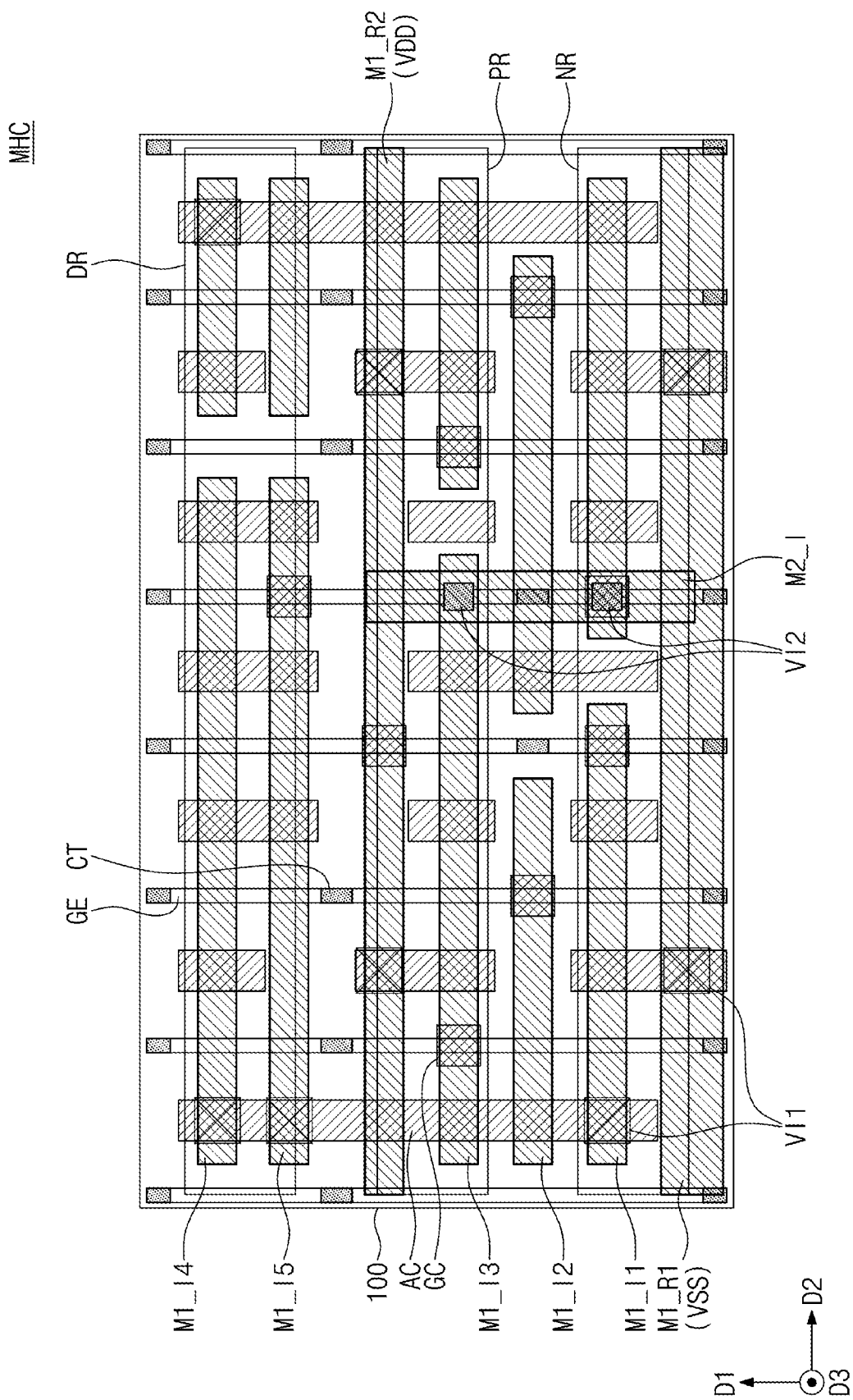

Referring to FIG. 15, the second power line M1_R2 may have a line-width less than that of the second power line M1_R2 depicted in FIG. 9. The line-width of the second power line M1_R2 may be less than that of the first power line M1_R1. A fifth lower line M1_I5 may be located adjacent to the second power line M1_R2. The fifth lower line M1_I5 may be located between the second power line M1_R2 and the fourth lower line M1_I4. The fifth lower line M1_I5 may be used as a signal line together with the first to fourth lower lines M1_I1 to M1_I4. As the fifth lower line M1_I5 is added, it may be possible to increase the number of signal lines and the degree of freedom of routing.

Figure 16:
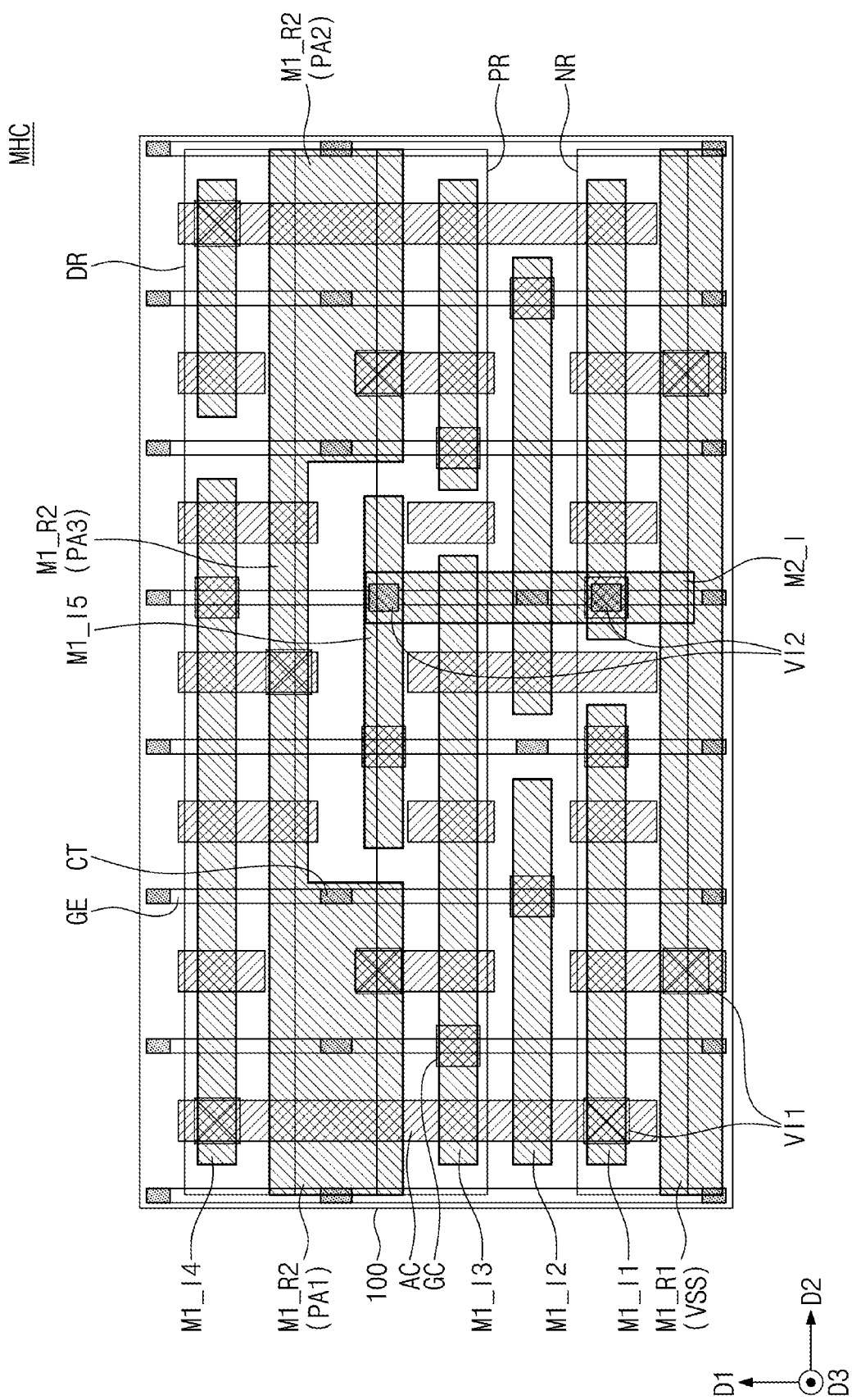

Referring to FIG. 16, the second power line M1_R2 may include a first part PA1, a second part PA2, and a third part PA3. The first part PA1 and the second part PA2 may be located adjacent to opposite sides of the mixed height cell MHC. The third part PA3 may connect the first part PA1 to the second part PA2. The third part PA3 may have a line-width less than that of each of the first and second parts PA1 and PA2. Therefore, the second power line M1_R2 may be shaped like U.

A fifth lower line M1_I5 may be located between the first part PA1 and the second part PA2. The fifth lower line M1_I5 may be located adjacent in the first direction D1 to the third part PA3. The fifth lower line M1_I5 may be used as a signal line together with the first to fourth lower lines M1_I1 to M1_I4. As the fifth lower line M1_I5 is added, it may be possible to increase the number of signal lines and the degree of freedom of routing.

Figure 17:
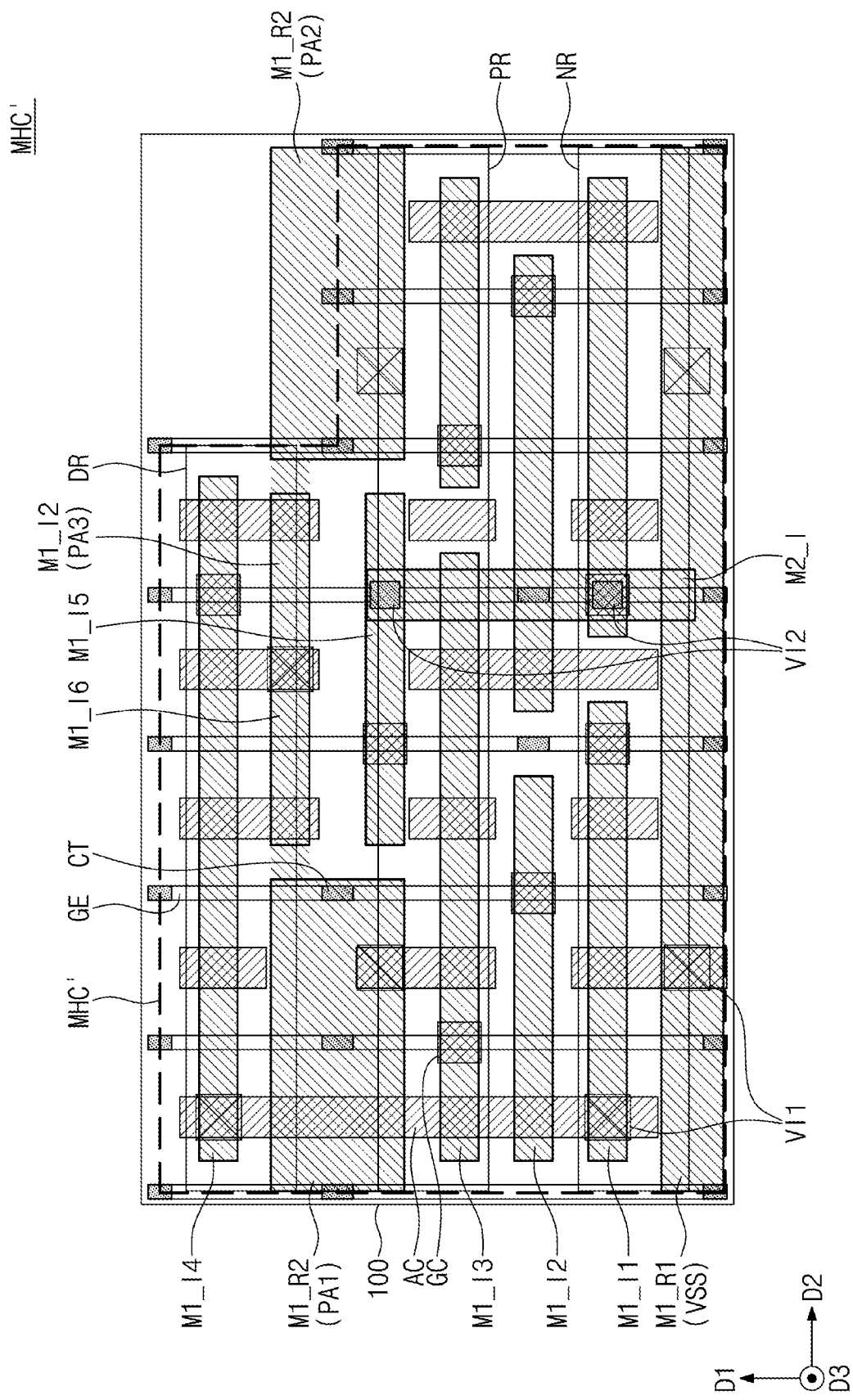

Referring to FIG. 17, a mixed height cell MHC' may be provided which is obtained by omitting a portion from the dummy region DR of the mixed height cell MHC depicted in FIG. 13. Like the mixed height cell MHC' of FIG. 4, the mixed height cell MHC' of FIG. 17 may have a polygonal shape. In comparison with the mixed height cell MHC of FIG. 13, the mixed height cell MHC' may have a reduced cell area while obtaining a similar degree of freedom of routing, which may result in an increase in integration of the mixed height cell MHC'.

Figure 18:
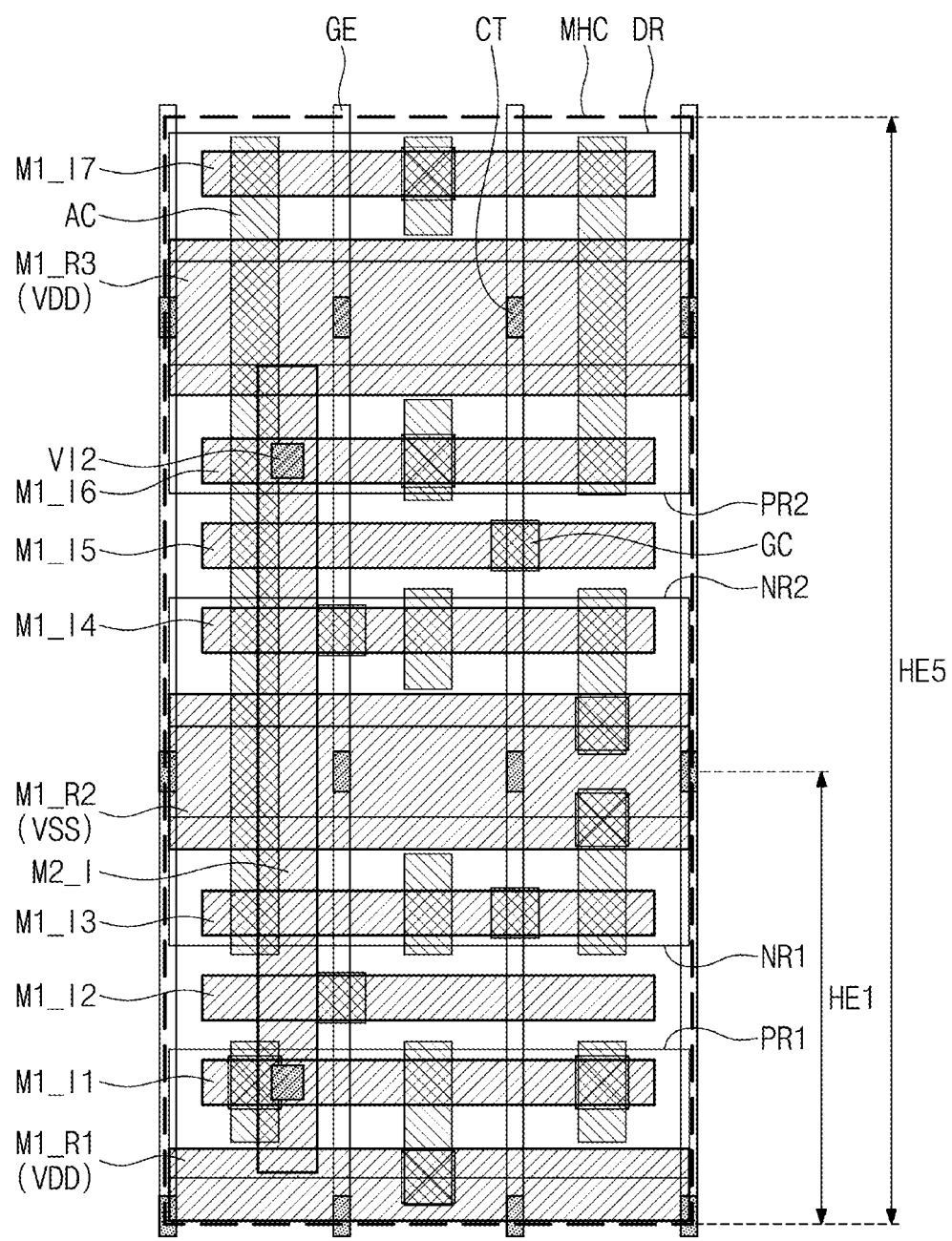
FIG. 18 illustrates a plan view of a semiconductor device for explaining a mixed height cell according to some embodiments of the present inventive concepts.

FIG. 18 illustrates a plan view showing a cross-coupled structure of a mixed height cell according to some embodiments of the present inventive concepts. Referring to FIG. 18, the mixed height cell MHC may be an AOI22 cell. The mixed height cell MHC may include first and second PMOSFET regions PR1 and PR2, first and second NMOSFET regions NR1 and NR2, and a dummy region DR. The mixed height cell MHC may have a fifth height HE5. The fifth height HE5 may be about 2.25 times to about 2.5 times the first height HE1 of the single height cell SHC.

The mixed height cell MHC may include first, second, and third lower lines M1_I1, M1_I2, and M1_I3 between the first and second power lines M1_R1 and M1_R2, and may also include fourth, fifth, and sixth lower lines M1_I4, M1_I5, and M1_I6 between the second and third power lines M1_R2 and M1_R3. The mixed height cell MHC may further include a seventh lower line M1_I7 on the dummy region DR.

In comparison with a double height cell, the mixed height cell MHC may additionally include the dummy region DR, and thus it may be possible to securely obtain not only the first to sixth lower lines M1_I1 to M1_I6, but the seventh lower line M1_I7. Therefore, it may be possible to limit/minimize an increase in area of the AOI22 cell and to increase the number of lower lines for routing.

Figure 19:
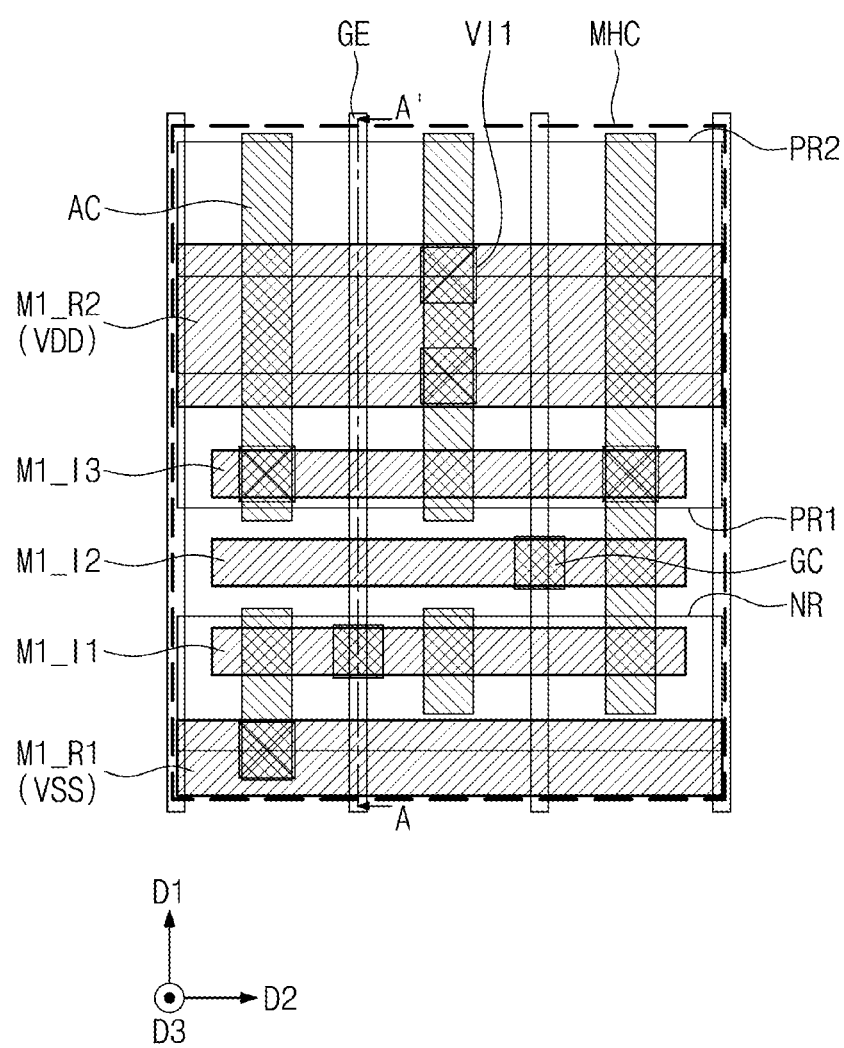
FIG. 19 illustrates a plan view of a semiconductor device for explaining a mixed height cell according to some embodiments of the present inventive concepts.
Figure 20:
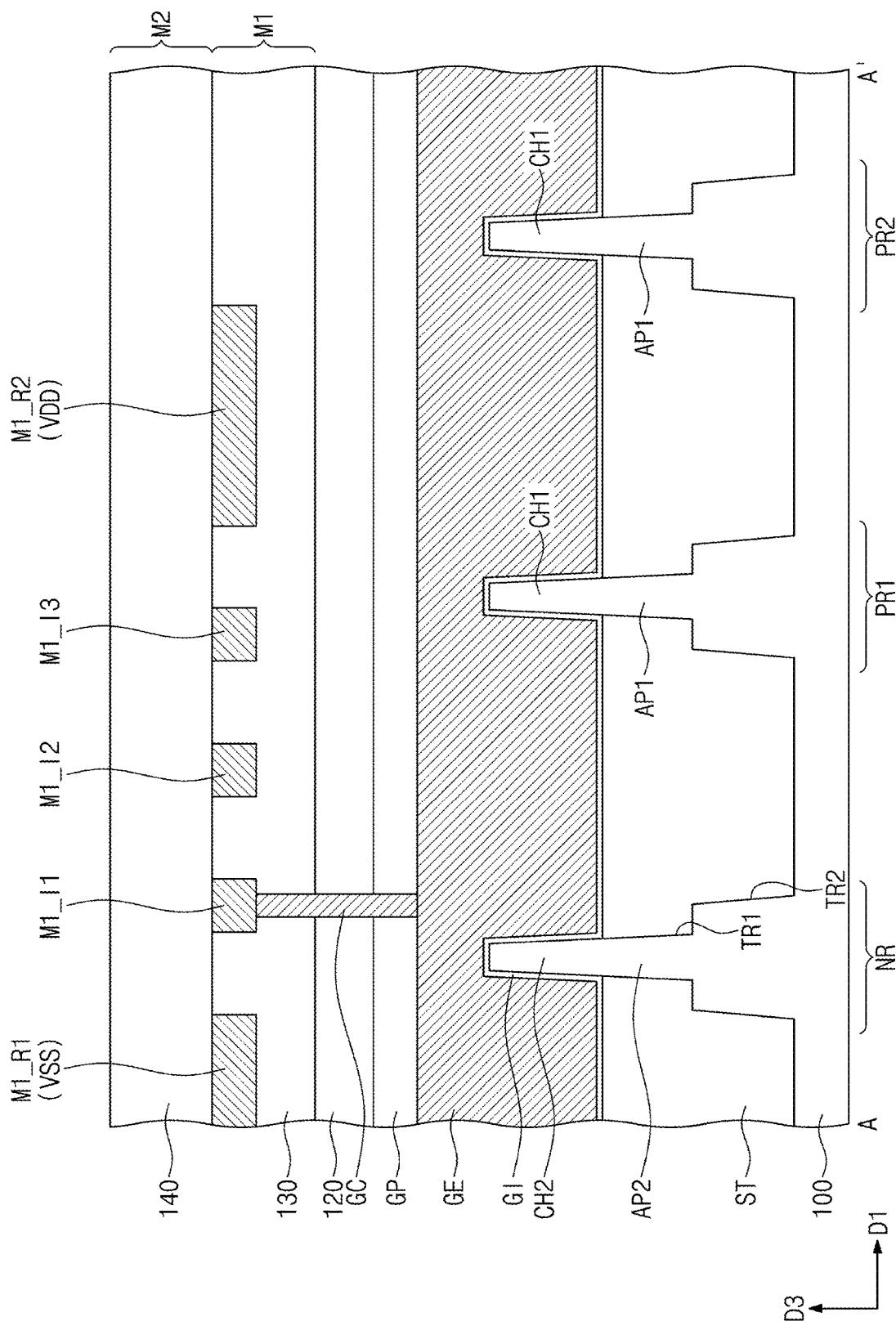
FIG. 20 illustrates a cross-sectional view taken along line A-A' of FIG. 19.

FIG. 19 illustrates a plan view showing a cross-coupled structure of a mixed height cell according to some embodiments of the present inventive concepts. FIG. 20 illustrates a cross-sectional view taken along line A-A' of FIG. 19. In the discussion that follows, a detailed description of technical features repetitive to those discussed above with reference to FIGS. 9 and 10A to 10E may be omitted, and a difference thereof will be discussed in detail.

Referring to FIGS. 19 and 20, the mixed height cell MHC may include a first PMOSFET region PR1, a second PMOSFET region PR2, and an NMOSFET region NR. Unlike the mixed height cell MHC discussed above with reference to FIG. 9, the dummy region DR may be replaced with the second PMOSFET region PR2.

The first and second PMOSFET regions PR1 and PR2 may be adjacent to each other across the second power line M1_R2. The first and second PMOSFET regions PR1 and PR2 may constitute one PMOSFET. For example, as shown in FIG. 20, a first active pattern AP1 may be provided on each of the first and second PMOSFET regions PR1 and PR2. The first active patterns AP1 on the first and second PMOSFET regions PR1 and PR2 may operate as one PMOSFET. Only one second active pattern AP2 may be provided on the NMOSFET region NR, and thus NMOSFETs may have driving forces less than those of PMOSFETs.

The mixed height cell MHC may be configured such that an NMOSFET and a PMOSFET have different channel sizes to induce a difference in driving force. For example, the mixed height cell MHC may be used to provide one of the NMOSFET and the PMOSFET with a driving force greater than that provided to the other of the NMOSFET and the PMOSFET in accordance with characteristics of a logic cell. In conclusion, the mixed height cell MHC according to some embodiments may cause a semiconductor device to have increased electrical characteristics.

The mixed height cell MHC according to the present inventive concepts may be used to produce an effect in which the PMOSFET has two fingers and the NMOSFET has one finger or in which the PMOSFET has one finger and the NMOSFET has two fingers. Therefore, a relative difference in driving force may be generated between the PMOSFET and the NMOSFET. For example, when a minimum supply voltage (Vmin) fail is produced from a flip-flop cell (or a desired function is not generated at low drain voltage VDD), the mixed height cell MHC may be used to relatively increase a driving force of a specific transistor and accordingly the Vmin fail may be impeded/prevented.

Figure 21:
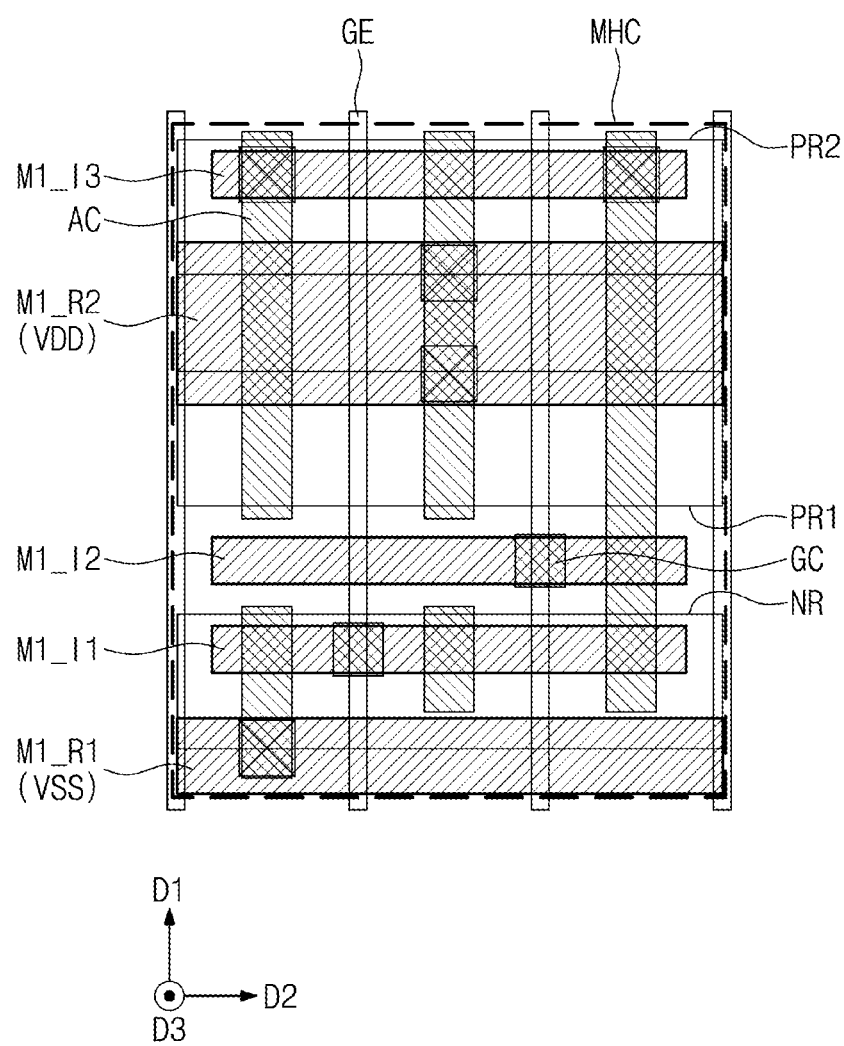
FIG. 21 illustrates a plan view of a semiconductor device for explaining a mixed height cell according to some embodiments of the present inventive concepts.

FIG. 21 illustrates a plan view of a semiconductor device for explaining a mixed height cell according to some embodiments of the present inventive concepts. Referring to FIG. 21, the third lower line M1_I3 may be provided not on the first PMOSFET region PR1, but on the second PMOSFET region PR2. Only the first and second lower lines M1_I1 and M1_I2 may be provided between the first and second power lines M1_R1 and M1_R2.

The mixed height cell MHC may decrease a density of lower lines by separating the third lower line M1_I3 from the first and second lower lines M1_I1 and M1_I2. In conclusion, capacitance between lower lines may be reduced to increase electrical characteristics of devices.

Figure 22:
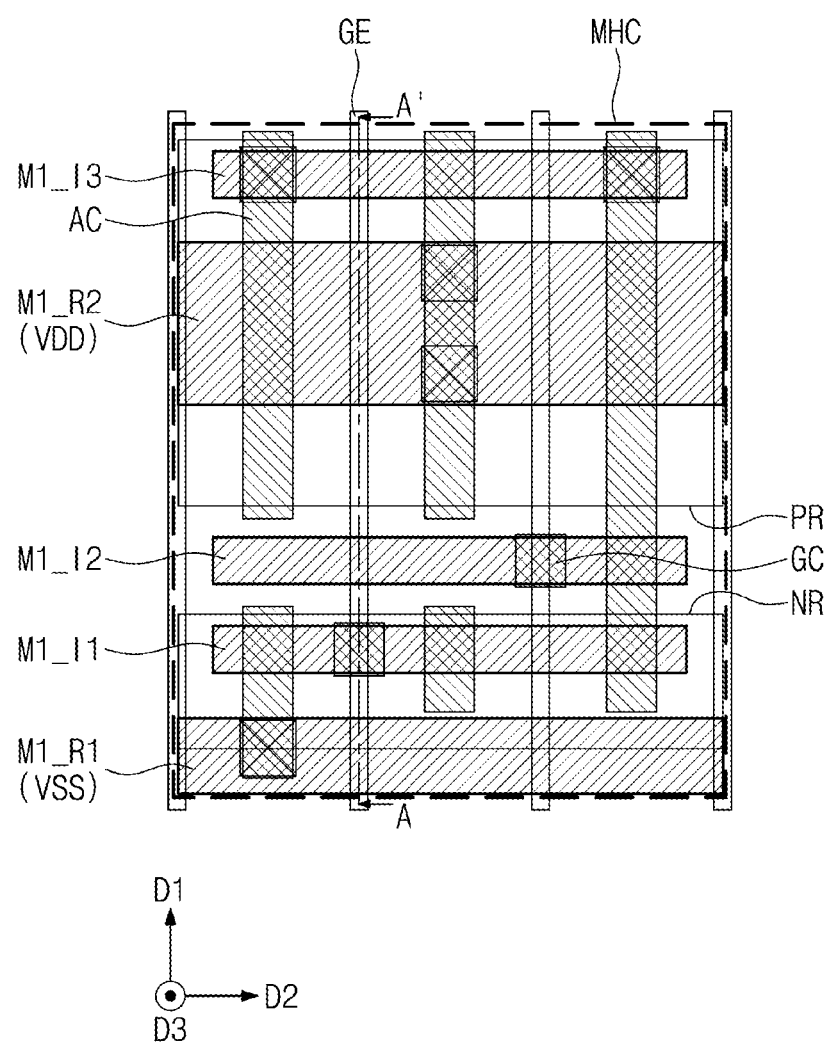
FIG. 22 illustrates a plan view of a semiconductor device for explaining a mixed height cell according to some embodiments of the present inventive concepts.
Figure 23:
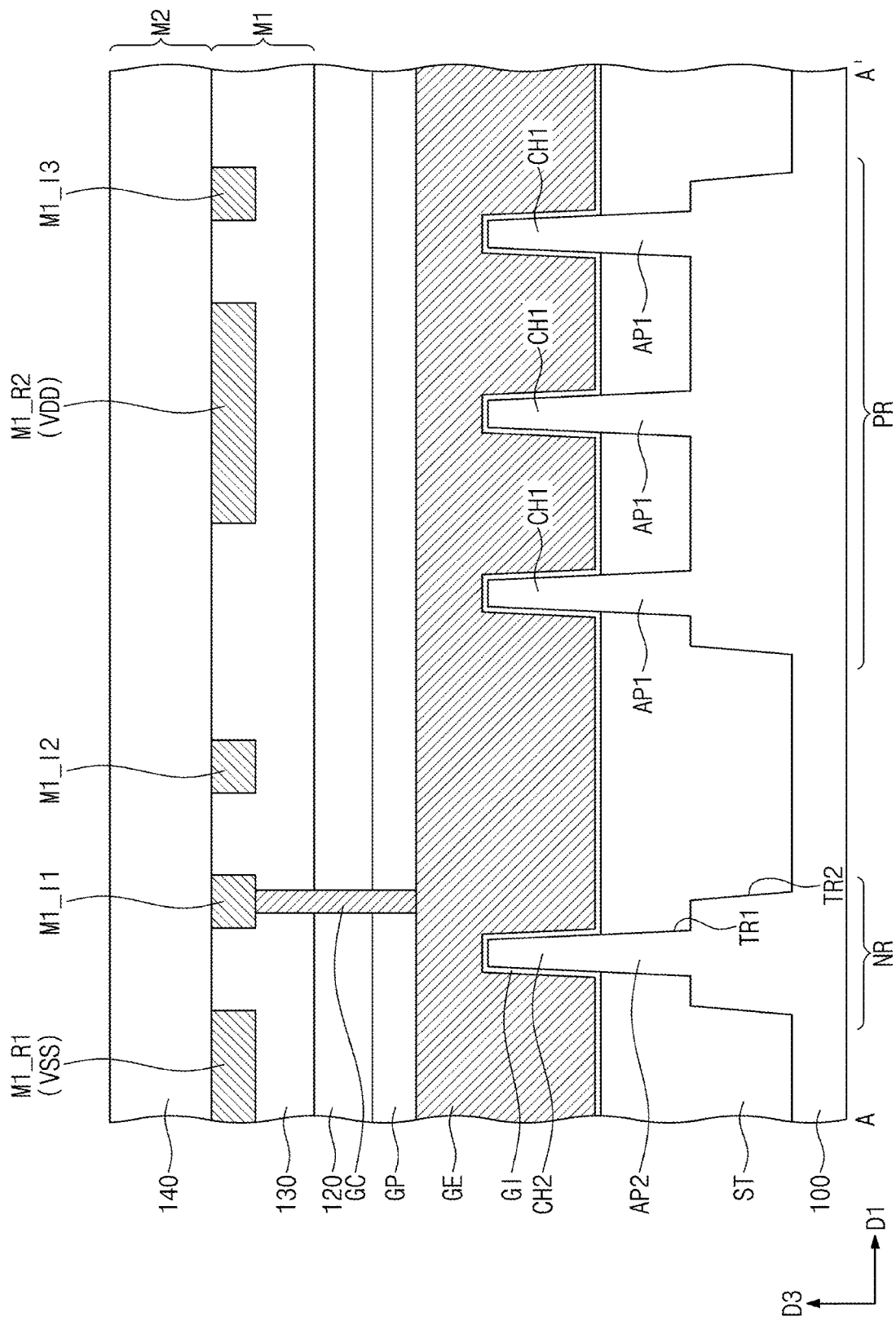
FIG. 23 illustrates a cross-sectional view taken along line A-A' of FIG. 22.

FIG. 22 illustrates a plan view of a semiconductor device for explaining an embodiment of the mixed height cell depicted in FIG. 19. FIG. 23 illustrates a cross-sectional view taken along line A-A' of FIG. 22. Referring to FIGS. 22 and 23, the mixed height cell MHC may include a PMOSFET region PR and an NMOSFET region NR. The PMOSFET region PR may have an area greater than that of the NMOSFET region NR. The area of the PMOSFET region PR may be greater than a sum of areas of the first and second PMOSFET regions PR1 and PR2 of FIG. 19.

For example, as shown in FIG. 23, three first active patterns AP1 may be provided on the PMOSFET region PR. The three first active patterns AP1 may operate as one PMOSFET. Only one second active pattern AP2 may be provided on the NMOSFET region NR, and thus NMOSFETs may have driving forces less than those of PMOSFETs.

Figure 25:
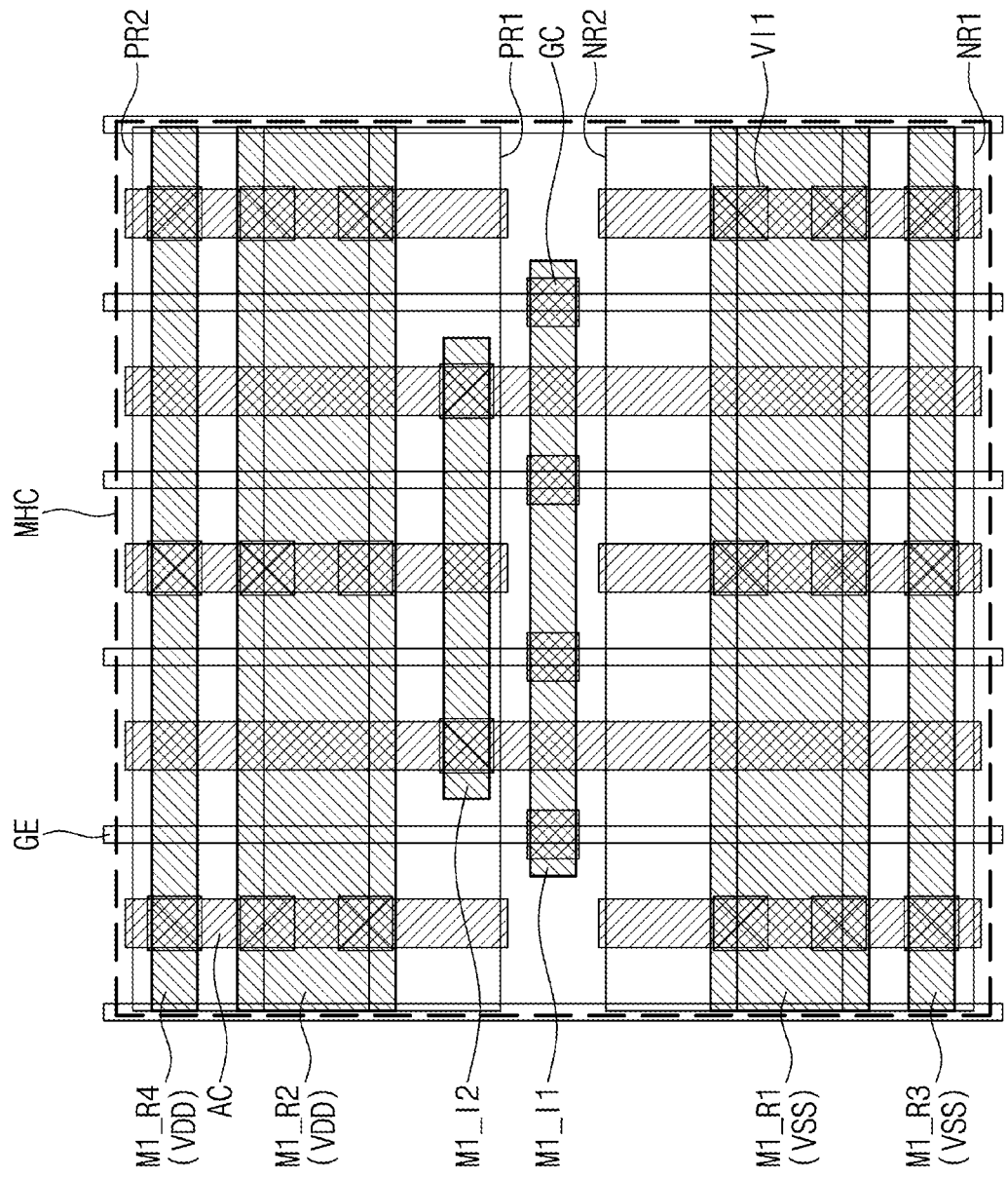
Figure 26:
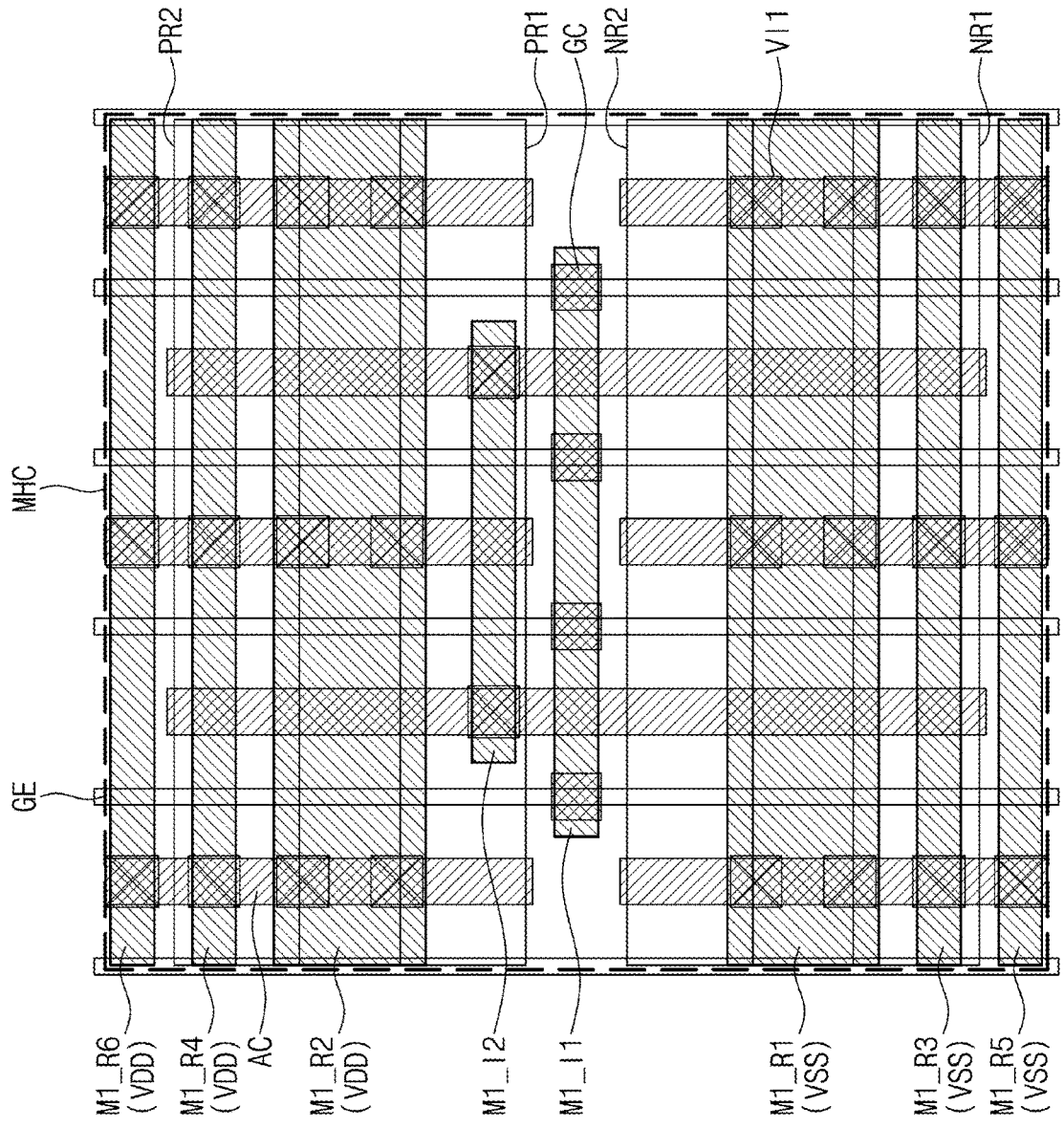
Figure 27:
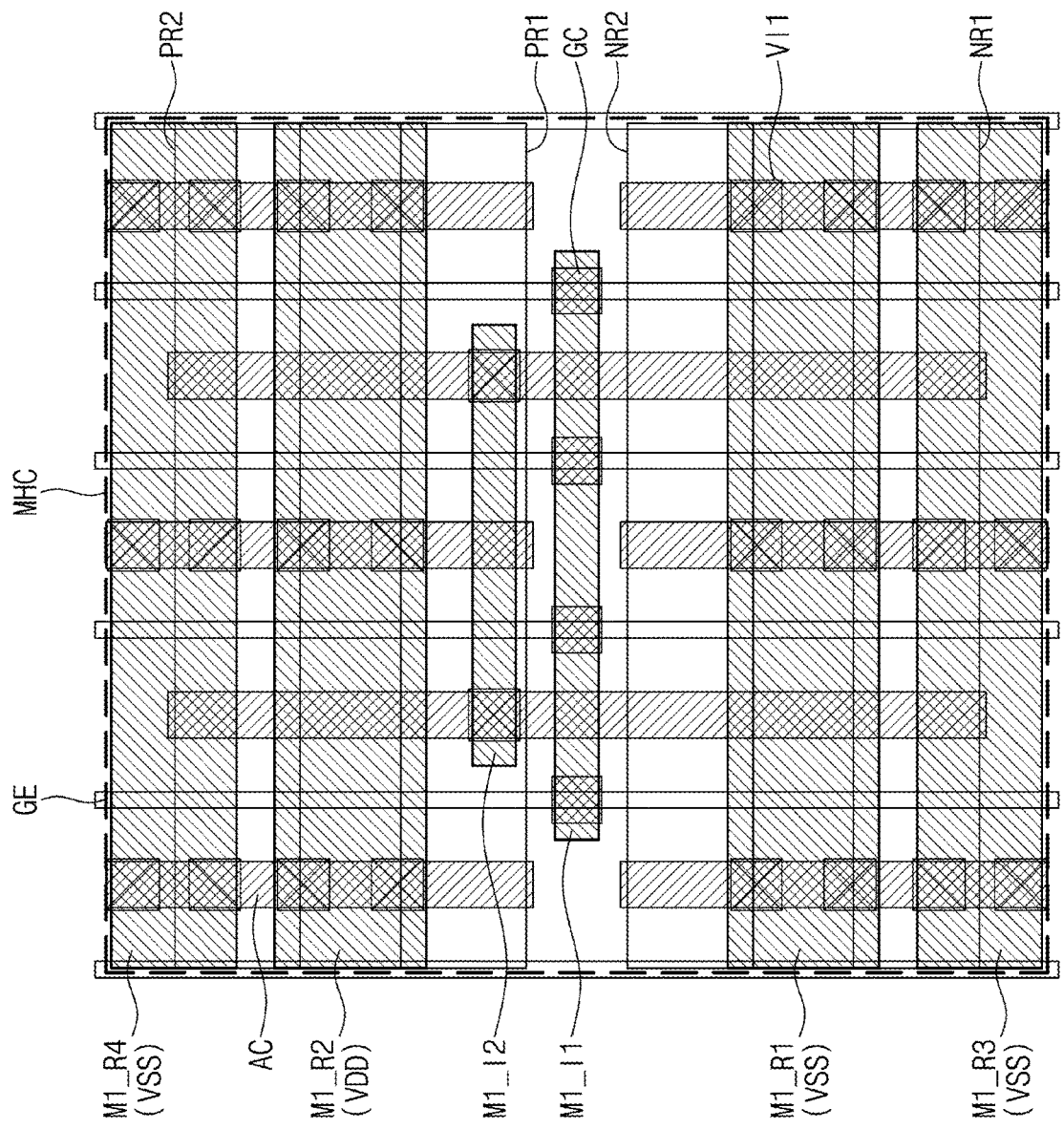

FIGS. 24 to 27 illustrate plan views of a semiconductor device for explaining examples of the mixed height cell depicted in FIG. 27. In the discussion that follows, a detailed description of technical features repetitive to those discussed above with reference to FIGS. 9 and 10A to 10E may be omitted, and a difference thereof will be discussed in detail.

Figure 24:
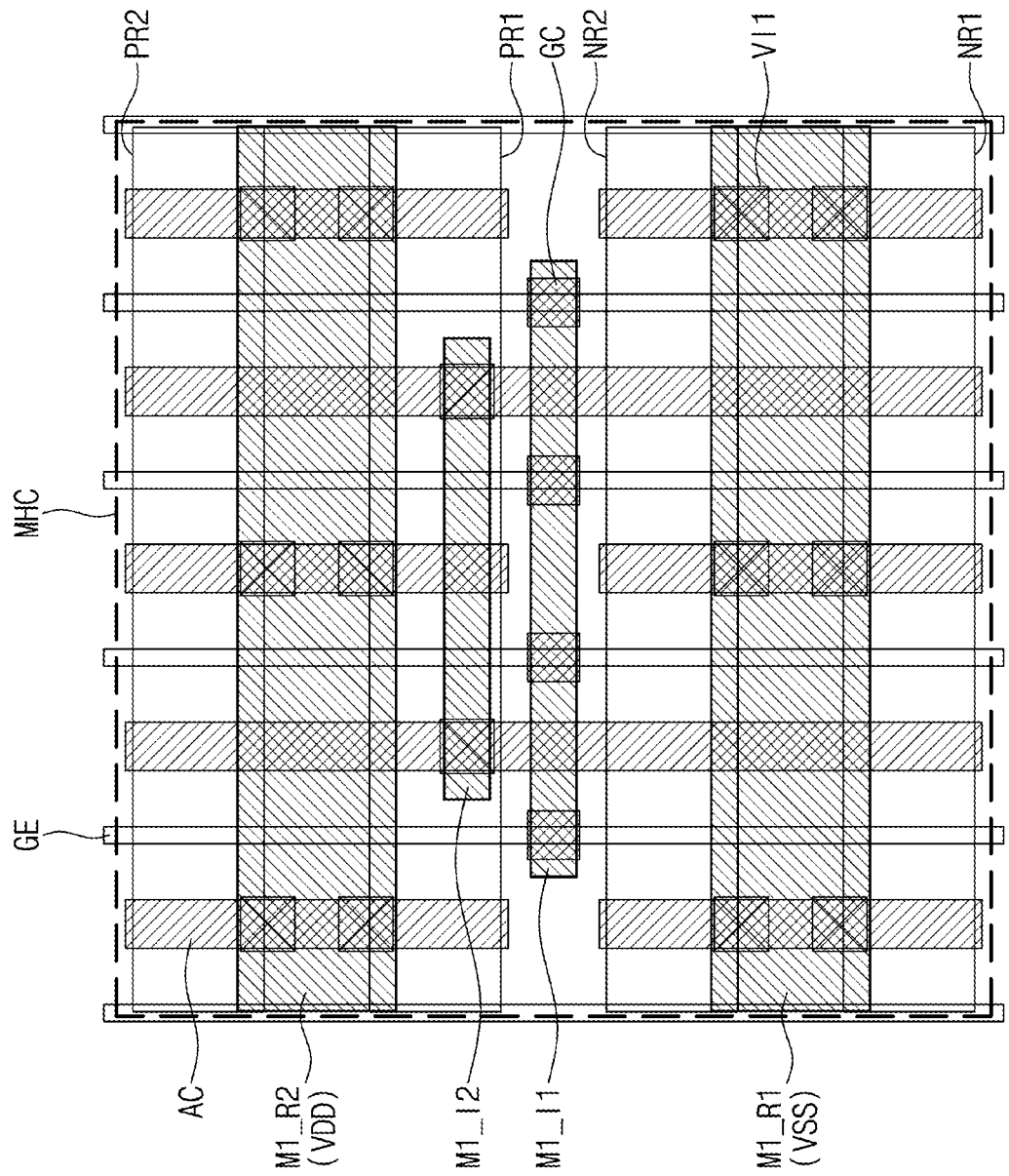
FIGS. 24 to 27 illustrate plan views of a semiconductor device for explaining a mixed height cell according to some embodiments of the present inventive concepts.

Referring to FIG. 24, the mixed height cell MHC may be an inverter cell. The mixed height cell MHC may include first and second PMOSFET regions PR1 and PR2 and first and second NMOSFET regions NR1 and NR2.

The first and second NMOSFET regions NR1 and NR2 may be adjacent to each other across the first power line M1_R1, and the first and second PMOSFET regions PR1 and PR2 may be adjacent to each other across the second power line M1_R2. The first and second lower lines M1_I1 and M1_I2 may be provided between the first and second power lines M1_R1 and M1_R2.

Similarly to that discussed above in FIGS. 19 and 20, the first and second PMOSFET regions PR1 and PR2 may collectively serve as one PMOSFET region. The first and second NMOSFET regions NR1 and NR2 may collectively serve as one NMOSFET region.

Referring to FIG. 25, the mixed height cell MHC may further include a third power line M1_R3 adjacent to the first power line M1_R1 and a fourth power line M1_R4 adjacent to the second power line M1_R2.

The third power line M1_R3 together with the first power line M1_R1 may be used as a path to which a source voltage VSS is provided. The fourth power line M1_R4 together with the second power line M1_R2 may be used as a path to which a drain voltage VDD is provided.

According to some embodiments, it may be possible to increase the number of power lines used for the mixed height cell MHC. The increase in the number of power lines may reduce a resistance of the power line, and source and drain voltages may thus be satisfactorily provided.

Referring to FIG. 26, the mixed height cell MHC may further include a fifth power line M1_R5 adjacent to the third power line M1_R3 and a sixth power line M1_R6 adjacent to the fourth power line M1_R4.

The first, third, and fifth power lines M1_R1, M1_R3, and M1_R5 may all be used as a path to which a source voltage VSS is provided. The second, fourth, and sixth power lines M1_R2, M1_R4, and M1_R6 may all be used as a path to which a drain voltage VDD is provided. According to some embodiments, the number of power lines may be increased to reduce a resistance of the power line.

Referring to FIG. 27, the mixed height cell MHC may further include a third power line M1_R3 adjacent to the first power line M1_R1 and a fourth power line M1_R4 adjacent to the second power line M1_R2. The third power line M1_R3 may have a line-width that is about 0.5 times to about 2 times that of the first power line M1_R1. The fourth power line M1_R4 may have a line-width that is about 0.5 times to about 2 times that of the second power line M1_R2.

The first and third power lines M1_R1 and M1_R3 may all be used as a path to which a source voltage VSS is provided. The second and fourth power lines M1_R2 and M1_R4 may all be used as a path to which a drain voltage VDD is provided. According to some embodiments, the number and areas of power lines may be increased to reduce a resistance of the power line.

A semiconductor device according to the present inventive concepts may be configured such that in comparison with a single height cell, a mixed height cell is used to increase the number of lines for signal delivery. Therefore, it may be possible to increase the degree of freedom of routing and electrical characteristics of the semiconductor device. The mixed height cell may have a cell height less than that of a double height cell, and accordingly a cell area may be reduced to increase integration.

A semiconductor device according to the present inventive concepts may be configured such that a mixed height cell is used to adjust a logic cell to have different channel sizes between PMOSFET and NMOSFET. Therefore, the mixed height cell may be applicable to a logic cell that uses/requires different driving forces between PMOSFET and NMOSFET. In conclusion, the semiconductor device may increase electrical characteristics.

Although the present inventive concepts have been described in connection with some embodiments of the present inventive concepts illustrated in the accompanying drawings, it will be understood by those skilled in the art that various substitutions, changes, and/or modifications may be made without departing from the scope of the present inventive concepts.

What is claimed is:

1. A semiconductor device comprising:
   a substrate that includes a first region, a second region, and a third region, the first region being an NMOSFET region, and the second region being a PMOSFET region;
   a first active pattern on the PMOSFET region and a second active pattern on the NMOSFET region;
   a plurality of gate electrodes on the first and second active patterns;
   a plurality of first source/drain patterns on an upper portion of the first active pattern and a plurality of second source/drain patterns on an upper portion of the second active pattern;
   a plurality of active contacts on the first and second source/drain patterns;
   a plurality of gate contacts on the gate electrodes; and
   a first metal layer on the active contacts and the gate contacts,
   wherein the first metal layer includes a first power line, a second power line, and first, second, third, and fourth lower lines,
   wherein the first, second, and third lower lines are between the first power line and the second power line,
   wherein the fourth lower line is on the third region,
   wherein the gate electrodes include first, second, third, and fourth gate electrodes,
   wherein the first gate electrode and the fourth gate electrode are configured to have a first signal applied in common thereto, and
   wherein the second gate electrode and the third gate electrode are configured to have a second signal applied in common thereto through the first lower line, the fourth lower line, and a first active contact of the active contacts that electrically connects the first lower line to the fourth lower line.

2. The semiconductor device of claim 1, wherein, when viewed in a plan view, the NMOSFET region and the PMOSFET region are between the first power line and the second power line, and the second power line is between the third region and the PMOSFET region.

3. The semiconductor device of claim 1,
   wherein the first region, the second region, and the third region are part of a mixed height cell, and
   wherein a cell height of the mixed height cell is about 1.25 times to about 1.5 times a distance between a first point of the first power line and a corresponding second point of the second power line.

4. The semiconductor device of claim 1, further comprising a second metal layer that includes an upper line on the first metal layer,
   wherein the first and fourth gate electrodes are configured to have the first signal supplied in common thereto through the upper line.

5. The semiconductor device of claim 1, wherein the third region is a dummy region.

6. The semiconductor device of claim 1,
   wherein first, second, and third line tracks are defined between the first power line and the second power line at a regular pitch,
   wherein a fourth line track is defined on the third region,
   wherein the first, second, and third lower lines are respectively aligned with the first, second, and third line tracks, and
   wherein the fourth lower line is aligned with the fourth line track.

7. The semiconductor device of claim 1,
   wherein the first metal layer further includes a fifth lower line,
   wherein the second power line includes a first part and a second part that are spaced apart from each other, and
   wherein the fifth lower line is between the first part and the second part.

8. The semiconductor device of claim 1,
   wherein the first metal layer further includes a fifth lower line,
   wherein the second power line includes a first part and a second part,
   wherein a line width of the first part is less than a line width of the second part, and
   wherein the fifth lower line is adjacent to the first part.

9. The semiconductor device of claim 1,
   wherein the first metal layer further includes a fifth lower line,
   wherein a line width of the second power line is less than a line width of the first power line, and
   wherein the fifth lower line is between the second power line and the fourth lower line.

10. The semiconductor device of claim 1,
    wherein the first metal layer further includes a fifth lower line,
    wherein the second power line includes a first part, a second part, and a third part,
    wherein a line width of the third part is less than a line width of each of the first and second parts,
    wherein the third part connects the first part to the second part, and
    wherein the fifth lower line is adjacent to the third part and is between the first part and the second part.

11. A semiconductor device comprising:
    a mixed height cell on a substrate; and
    a first power line and a second power line that run across the mixed height cell,
    wherein first, second, and third line tracks are defined between the first power line and the second power line, wherein a fourth line track is defined adjacent to the second power line, wherein the second power line is between the third line track and the fourth line track, wherein the mixed height cell includes:
- a first region and a second region between the first power line and the second power line;
- a third region adjacent to the second power line, wherein the second power line is between the second region and the third region; and
- first, second, third, and fourth lower lines aligned with the first, second, third, and fourth line tracks, respectively, wherein a cell height of the mixed height cell is about 1.25 times to about 1.5 times a distance between a first point of the first power line and a corresponding second point of the second power line, and wherein:

the third region is a dummy region, and the fourth lower line on the fourth line track comprises a signal line of the mixed height cell; or the first region and the second region are an NMOSFET region and a PMOSFET region, respectively, the third region is an additional PMOSFET region, and the second region and the third region are configured to collectively serve as one PMOSFET.

12. The semiconductor device of claim 11,
wherein the mixed height cell includes a first cell region and a second cell region,
wherein the first cell region has the cell height, and
wherein the second cell region has a cell height equal to the distance.

13. The semiconductor device of claim 11,
wherein the first region and the second region are the NMOSFET region and the PMOSFET region, respectively, the third region is the additional PMOSFET region, and the second region and the third region are configured to collectively serve as the one PMOSFET, and
wherein a channel size of the one PMOSFET of the mixed height cell is greater than a channel size of an NMOSFET on the NMOSFET region.

14. A semiconductor device comprising:
a mixed height cell on a substrate; and
a first power line and a second power line that run across the mixed height cell, wherein first, second, third, and third line tracks are defined between the first power line and the second power line, wherein a fourth line track is defined adjacent to the second power line, wherein the second power line is between the third line track and the fourth line track, wherein the mixed height cell includes:
- first, second, third, and fourth gate electrodes;
- a plurality of lower lines aligned with the first, second, third, and fourth line tracks; and
- an upper line on the lower lines, wherein the first gate electrode and the fourth gate electrode are configured to have a first signal applied in common thereto through the upper line, and wherein the second gate electrode and the third gate electrode are configured to have a second signal applied in common thereto through a first lower line of the plurality of lower lines on one of the first, second, or third line tracks and through a second lower line of the plurality of lower lines on the fourth line track.

15. The semiconductor device of claim 14,
wherein the mixed height cell further includes an active contact that extends from the first lower line to the second lower line, and
wherein the first and second lower lines are electrically connected to each other through the active contact.

16. The semiconductor device of claim 15, wherein the mixed height cell further includes:
a first gate contact between the first lower line and the third gate electrode; and
a second gate contact between the second lower line and the second gate electrode.

17. The semiconductor device of claim 14,
wherein the mixed height cell further includes:
a PMOSFET region and an NMOSFET region between the first power line and the second power line; and
a dummy region adjacent to the second power line, and
wherein the second power line is between the PMOSFET region and the dummy region.

* * * * *